United States Patent
Faircloth et al.

(10) Patent No.: US 10,323,460 B2
(45) Date of Patent: Jun. 18, 2019

(54) VISIBLE DIODE LASER SYSTEMS, APPARATUS AND METHODS OF USE

(71) Applicant: Foro Energy, Inc., Houston, TX (US)

(72) Inventors: Brian O. Faircloth, Evergreen, CO (US); Ian Lee, Highlands Ranch, CO (US); Andrey Kuznetsov, Highlands Ranch, CO (US)

(73) Assignee: Foro Energy, Inc., Houston, TX (US)

( * ) Notice: Subject to any disclaimer, the term of this patent is extended or adjusted under 35 U.S.C. 154(b) by 0 days.

(21) Appl. No.: 15/821,411

(22) Filed: Nov. 22, 2017

(65) Prior Publication Data

US 2018/0163477 A1 Jun. 14, 2018

Related U.S. Application Data

(63) Continuation-in-part of application No. 15/064,165, filed on Mar. 8, 2016.
(Continued)

(51) Int. Cl.
| | |
|---|---|
| *G02B 6/42* | (2006.01) |
| *E21B 7/15* | (2006.01) |
| *H01S 5/40* | (2006.01) |
| *H01S 5/00* | (2006.01) |
| *H01S 5/022* | (2006.01) |
| *H01S 5/042* | (2006.01) |
| *B23K 26/00* | (2014.01) |
| *B23K 26/06* | (2014.01) |
| *B23K 26/046* | (2014.01) |
| *B23K 26/08* | (2014.01) |
| *B23K 26/382* | (2014.01) |
| *B23K 26/70* | (2014.01) |
| *E21B 29/02* | (2006.01) |
| *H01S 5/024* | (2006.01) |

(Continued)

(52) U.S. Cl.
CPC ............ *E21B 7/15* (2013.01); *B23K 26/0096* (2013.01); *B23K 26/046* (2013.01); *B23K 26/0608* (2013.01); *B23K 26/0869* (2013.01); *B23K 26/382* (2015.10); *B23K 26/703* (2015.10); *E21B 29/02* (2013.01); *H01S 5/0071* (2013.01); *H01S 5/02296* (2013.01); *H01S 5/02423* (2013.01); *H01S 5/042* (2013.01); *H01S 5/4025* (2013.01); *E21B 37/00* (2013.01); *E21B 43/11* (2013.01); *G02B 6/3624* (2013.01); *G02B 6/4296* (2013.01); *G02B 6/4417* (2013.01); *G02B 6/4427* (2013.01)

(58) Field of Classification Search
None
See application file for complete search history.

(56) References Cited

U.S. PATENT DOCUMENTS

| | | | |
|---|---|---|---|
| 6,026,109 A | * | 2/2000 | Micke ..................... H01S 3/025 372/10 |
| 8,511,401 B2 | | 8/2013 | Zediker et al. |

(Continued)

*Primary Examiner* — Chad H Smith
(74) *Attorney, Agent, or Firm* — Glen P. Belvis; Belvis Law, LLC.

(57) ABSTRACT

Systems, apparatus and methods for performing laser operations in boreholes and other remote locations, such operations including laser drilling of a borehole in the earth. Systems, apparatus and methods for generating and delivering high power laser energy below the surface of the earth and within a borehole. Laser operations using such downhole generated laser beams.

16 Claims, 8 Drawing Sheets

Related U.S. Application Data

(60) Provisional application No. 62/425,793, filed on Nov. 23, 2016, provisional application No. 62/266,509, filed on Dec. 11, 2015.

(51) Int. Cl.
| | |
|---|---|
| *E21B 37/00* | (2006.01) |
| *E21B 43/11* | (2006.01) |
| *G02B 6/36* | (2006.01) |
| *G02B 6/44* | (2006.01) |

(56) References Cited

U.S. PATENT DOCUMENTS

| | | |
|---|---|---|
| 8,571,368 B2 | 10/2013 | Rinzler et al. |
| 8,826,973 B2 | 9/2014 | Moxley et al. |
| 9,242,309 B2 | 1/2016 | Zediker et al. |
| 9,244,235 B2 | 1/2016 | Norton et al. |
| 9,677,338 B2 | 6/2017 | Braga |
| 2012/0273470 A1 | 11/2012 | Zediker et al. |
| 2013/0112478 A1 | 5/2013 | Braga |
| 2016/0084008 A1 | 3/2016 | Faircloth et al. |
| 2016/0186524 A1 | 6/2016 | Faircloth et al. |

* cited by examiner

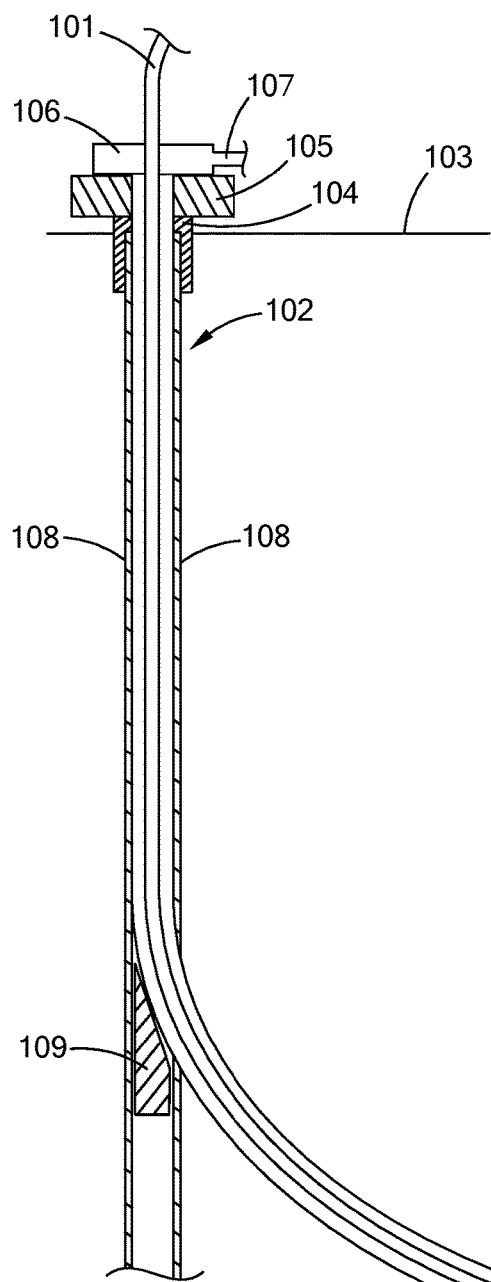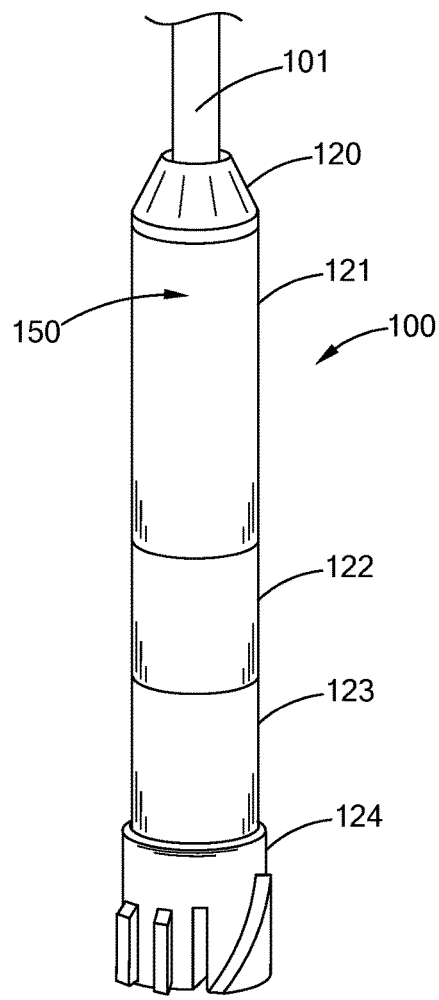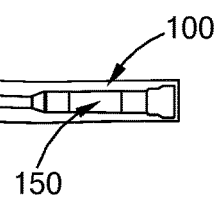
FIG. 1
FIG. 1A

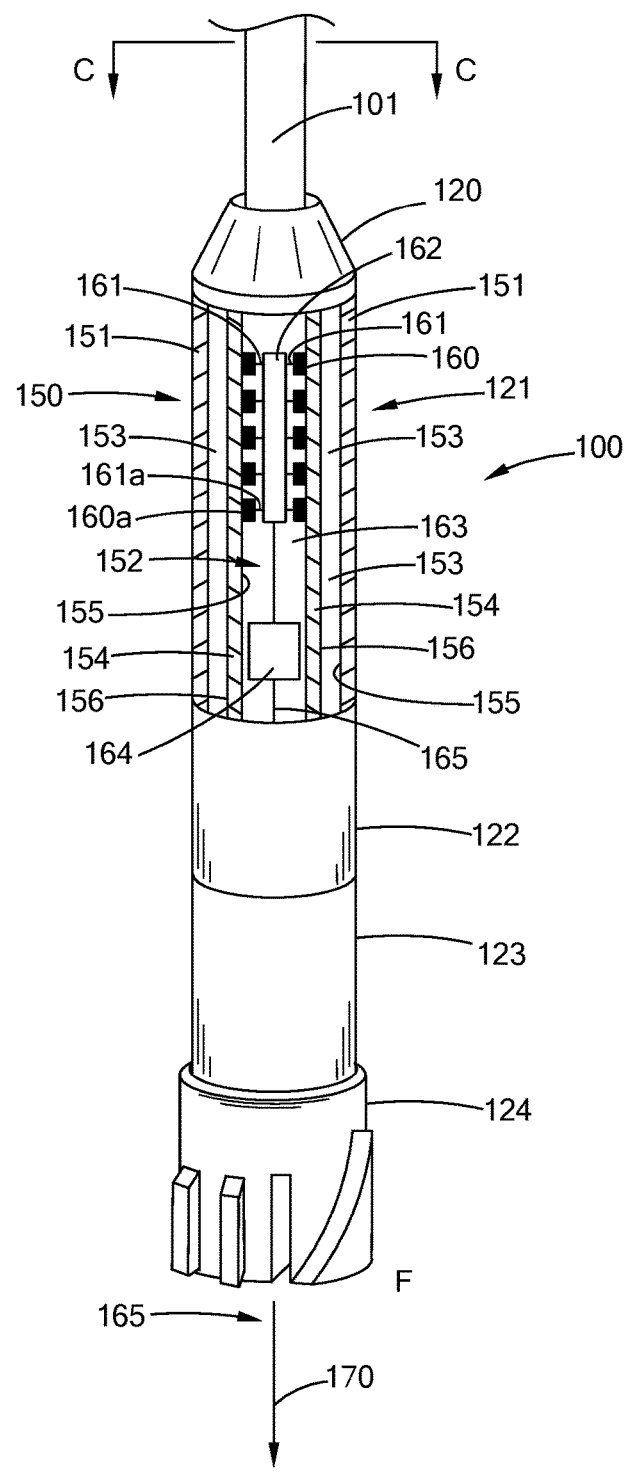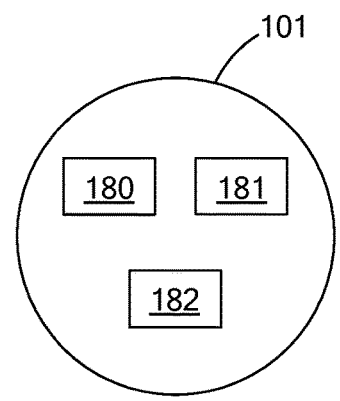
FIG. 1B
FIG. 1C

VISIBLE DIODE LASER SYSTEMS, APPARATUS AND METHODS OF USE

This application:
(i) claims under 35 U.S.C. § 119(e)(1) the benefit of the filing date of provisional application Ser. No. 62/425,793, filed Nov. 23, 2016; and,
(ii) is a continuation-in-part of Ser. No. 15/064,165, filed Mar. 8, 2016, which claims under 35 U.S.C. § 119(e)(1) the benefit of the filing date of provisional application Ser. No. 62/266,509, filed Dec. 11, 2015;
the entire disclosures of each of which are incorporated herein by reference.

BACKGROUND OF THE INVENTION

The present invention relates to methods, apparatus and systems for generating and delivering high power laser energy to perform laser operations, including drilling, welding, cutting and cladding operations. In a particular, an embodiment of the present invention relates to generating and providing high power laser energy, down hole, to provide laser energy for performing laser operations in a borehole.

As used herein, unless specified otherwise "high power laser energy" means a laser beam having at least about 1 kW (kilowatt) of power. As used herein, unless specified otherwise "great distances" means at least about 500 m (meter). As used herein, unless specified otherwise, the term "substantial loss of power," "substantial power loss" and similar such phrases, mean a loss of power of more than about 3.0 dB/km (decibel/kilometer) for a selected wavelength. As used herein the term "substantial power transmission" means at least about 50% transmittance.

As used herei the term "very high brightness laser" should be given its broadest possible meaning, unless specifically stated otherwise, and would include laser beams having an $M^2$ of 2 or less, a beam parameter product (BPP) of 50 mm mrad (millirad) or less, and laser beams having both of these properties, as well as the lasers that produce such laser beams.

Generally, the term "about" as used herein unless specified otherwise is meant to encompass a variance or range of ±10%, the experimental or instrument error associated with obtaining the stated value, and preferably the larger of these.

As used herein, unless specified otherwise, the terms "at least _____" or "greater than _____" means the same thing as "not having lower than _____" or "excluding lower than _____" or "not having less than _____" or "excluding less than _____." Thus, the term "at least 10 kW" is the same as, and means the same thing as, the terms "not having a power lower than 10 kW" or "not having a power less than 10 kW". Similarly, the term "greater than 10 kW" means the same thing as the terms "excluding a power lower than 10 kW" or "excluding a power less than 10 kW."

SUMMARY

It is desirable to develop systems and methods that provide for the delivery of high power laser energy to the bottom of a deep borehole to advance that borehole at a cost effective rate, and in particular, to be able to deliver such high power laser energy to drill through rock layer formations including granite, basalt, sandstone, dolomite, sand, salt, limestone, rhyolite, quartzite and shale rock at a cost effective rate. More particularly, it is desirable to develop systems and methods that provide for the ability to deliver such high power laser energy to drill through hard rock layer formations, such as granite and basalt, at a rate that is superior to prior conventional mechanical drilling operations. The present invention, among other things, solves these needs by providing the system, apparatus and methods taught herein.

Thus there is provided herein a high power laser drilling system for advancing a borehole the system having a source of high power laser energy, the laser source capable of providing a laser beam having at least 5 kW of power, the system further having a tubing assembly, the tubing assembly having at least 1000 feet of tubing and having a distal end and a proximal, the system further having a source of fluid for use in advancing a borehole. The components of the system are configured so that the proximal end of the tubing is in fluid communication with the source of fluid, whereby fluid is transported in association with the tubing.

Further there is provided the systems and methods provided herein wherein the laser source comprises a single laser, comprises two lasers and comprises a plurality of lasers is provided.

Moreover, there is provided a high power laser downhole system for performing downhole operations, the system having: a downhole assembly, wherein the downhole assembly is configured for operation within a bore hole; the downhole assembly having: a high power laser, capable of providing a high power laser beam: wherein the high power laser beam has at least about 5 kW of power, has a wavelength selected from the range of 455 nm to about 810 nm; has a wavelength of from about 400 nm to about 1,500 nm; has a wavelength of about 400 to about 900 nm, a working fluid, the working fluid having an absorptivity for the laser beam; wherein the absorptivity is less than 0.001 1/cm; wherein the absorptivity is less than about 11/cm; wherein the absorptivity is less than about 0.11/cm; wherein the absorptivity is less than about 0.01 1/cm; a bottom hole assembly, having laser optics and an opening for discharging the working fluid; the high power laser, the laser optics and the opening in optical communication; and, a cooling system for the high power laser; and, a conveying system for advancing the downhole assembly into a borehole.

Yet further there is provided methods, apparatus and systems having one or more of the following features: wherein the high power laser has a plurality of diode lasers; wherein the high power laser has a plurality of high brightness diode lasers; wherein the high power laser has a plurality of high brightness diode lasers; wherein the laser beam has an $M^2$ of less than about 200; wherein the laser beam has an $M^2$ of less about 90; wherein the laser beam has an $M^2$ of less than about 50; wherein the laser beam has an $M^2$ of less than about 10; wherein the laser beam has an $M^2$ of less than about 5; wherein the laser beam has an $M^2$ of less than 3; wherein the laser beam has an $M^2$ of less than 2; wherein the high power laser has a plurality phase arrayed diode lasers; wherein the high power laser has a high brightness diode laser; and wherein the laser beam has a beam parameter of less than 200 mm milliard; wherein the laser beam has a beam parameter of less than 100 mm milliard; wherein the laser beam has a beam parameter of less than 500 mm milliard; wherein the laser beam has a beam parameter of less than 100 mm millirad; wherein the high power laser has a high brightness diode laser; and wherein the laser beam has a beam parameter of less than 50 mm millirad; wherein the high power laser has a high brightness diode laser; and wherein the laser beam has a beam parameter of less than 15 mm millirad; wherein the power source is selected from the group consisting of an optical power source, a power cable, and a downhole electrical generator; wherein the cooling system used sorption to cool the laser (In general, sorption cooling is a technology that uses heat to produce cooling, by taking advantage of material properties. One substance will heat or refrigerate depending on whether it is absorbed or released by another substance. There may be a third substance that is displaced when the first substance is absorbed and re-absorbed when the first substance is released. The absorption and release are dependent on ambient temperature); wherein the working fluid is a cooling fluid; wherein the conveying system is selected from the group consisting of coiled tubing and a drill-string; wherein the power source is selected from the group consisting of an optical power source, a electrical power cable, and a downhole electrical generator; wherein the cooling system is capable of maintaining the temperature of the high power laser below 50° C.; and, wherein the conveying system is selected from the group consisting of land based rigs, mobile land based rigs, fixed tower rigs, barge rigs, drill ships, jack-up platforms, and semi-submersible rigs; and having a power source for the high power laser, wherein the power source is selected from the group consisting of an optical power source, an electrical power cable, and a downhole electrical generator; wherein the cooling system has the working fluid at a temperature below the operating diode laser temperature; and, wherein the conveying system is selected from the group consisting of land based rigs, mobile land based rigs, fixed tower rigs, barge rigs, drill ships, jack-up platforms, coiled tubing, a drill-string and semi-submersible rigs.

Further there is provided a high power laser bottom hole assembly having: a high power laser, the high power laser having an array of diodes capable of providing a high power laser beam; the high power laser beam having at least about 5 kW of power, having an $M^2$ of less than 2, having a beam parameter of less than 100 mm millirad, and having a wavelength selected from the range of about 455 nm to about 810 nm; a cooling system for the high power laser; a channel for directing a working fluid; and, laser optics, whereby the high power laser and the laser optics are in optical communication, thereby providing the ability to direct the high power laser beam within the bottom hole assembly, out of the bottom hole assembly and to a downhole target.

Still further there is provided a high power laser system for performing downhole operations, the system having: a downhole assembly, wherein the downhole assembly is configured for operation within a bore hole; the downhole assembly having: a high power laser, capable of generating a high power laser beam: wherein the high power laser beam has at least about 5 kW of power, has an $M^2$ of less than 2, has a beam parameter of less than 100 mm millirad, and has a wavelength less than 810 nm; a source of power for the high power laser, wherein the source of power is selected from the group consisting of an optical power source, a power cable, and a downhole electrical generator; a working fluid, the working fluid having an absorptivity for the laser beam; wherein the absorptivity is less than 4% per inch; a bottom hole assembly, having laser optics and an opening for discharging the working fluid; the high power laser near to the bottom hole assembly, whereby the high power laser and the bottom hole assembly are in optical communication, thereby providing the ability to direct the high power laser beam within the bottom hole assembly, out of the opening and to a downhole target, whereby the laser beam and the working fluid are coincident in the opening; and, a means for conveying the down assembly into the borehole, said means selected from the group consisting of land based rigs, mobile land based rigs, fixed tower rigs, barge rigs, drill ships, jack-up platforms, and semi-submersible rigs.

Moreover, there is provided a method of performing downhole laser operations in a bore hole below the surface of the earth, the method having: lowering an assembly having a high power laser below the surface of the earth into a borehole; providing a source of power to the high power laser; generating below the surface of the earth in the borehole a high power laser beam having at least 5 kW of power and a wavelength less than 810 nm; directing the high power laser beam through optics, whereby the laser beam is shaped into a predetermined pattern; and, directing the laser beam to a target in the borehole to perform a laser operation.

Still further there are provided methods, apparatus and systems having one or more of the following features: wherein the target is selected from the group consisting of a downhole plug, a production casing, a casing, a bore hole sidewall, and a bottom of a borehole; wherein the laser operation is selected from the group consisting of advancing the well bore, finishing the well bore, and workover activities; wherein the laser operation is selected from the group consisting of drilling, perforating, window cutting, pipe cutting, and plug removal; wherein generating below the surface of the earth in the borehole a high power laser beam having combining laser beams from a plurality of laser sources; wherein the high power laser has a diode laser; wherein the high power laser has a plurality of high brightness diode lasers; and wherein the laser beam has an $M^2$ of less than 2; wherein the high power laser has a plurality phase arrayed diode lasers; wherein the high power laser has a high brightness diode laser; and wherein the laser beam has a beam parameter of less than 100 mm millirad; wherein the high power laser has a high brightness diode laser; and wherein the laser beam has a beam parameter of less than 50 mm millirad; wherein the high power laser has a high brightness diode laser; and wherein the laser beam has a beam parameter of less than 15 mm millirad; wherein the power source is selected from the group consisting of an optical power source, a power cable, and a downhole electrical generator; having sorption cooling of the laser; delivering a working fluid to the target, wherein the working fluid has been selected to minimize the absorption of the laser beam; wherein the absorption of the laser beam by the working fluid is less than 0.001 1/cm; wherein the absorption of the laser beam by the working fluid is less than 4% per inch; wherein the absorption of the laser beam by the working fluid is less than 0.1% per inch; lowering the assembly from a field unit, the field unit selected from the group consisting of land based rigs, mobile land based rigs, fixed tower rigs, barge rigs, drill ships, jack-up platforms, and semi-submersible rigs; wherein the target is selected from the group consisting of the bottom of a borehole, the side wall of a borehole, a casing, a tubular, an interior surface of a tubular, an exterior surface of a tubular, and a subsea structure.

Still further there is provided a method of performing laser operations below the surface of the earth, the method having: lowering an assembly having a high power laser beam source below the surface of the earth to a depth within a borehole, the high power laser beam source having a plurality of lasers, wherein the lasers are capable of generating laser beams having wavelengths of less than 810 nm; providing a source of power to the high power laser source; generating below the surface of the earth in the borehole a plurality of laser beam having wavelengths of less than 810 nm; combining a plurality of the laser beams to form a single high power laser beam having at least 10 kW of power and a wavelength less than 810 nm; cooling the high power laser source to a temperature at or below 100° C.; cooling the high power laser source to a temperature at or below 120° C.; cooling the high power laser source to a temperature at or below 70° C.; cooling the high power laser source to a temperature at or below 50° C.; and, directing the single high power laser beam to a target in the borehole to perform a laser operation.

Additionally, there are provided methods, apparatus and systems having one or more of the following features: wherein the single high power laser beam has a power of at least 10 kW; wherein the single high power laser beam has a power of at least 20 kW; wherein the laser operation is selected from the group consisting of cutting, heat treating, thermal processing, annealing, advancing a borehole, workover and completion, removing material, cleaning, milling, flow assurance, decommissioning, plugging, abandonment and perforating; wherein the cooling has sending a liquid downhole, the liquid having a temperature lower than an ambient temperature in the borehole at the depth of the high power laser source; wherein the power source is electrical, and the electrical optical efficiency of the high power laser is at least 10%; and the electrical optical efficiency of the high power laser is at least 5%, and the electrical optical efficiency of the high power laser is at least 20%, and the electrical optical efficiency of the high power laser is at least 30%, and wherein the power source is electrical, and the electrical optical efficiency of the high power laser is at least 25%.

Further there is provided a method of performing downhole laser operations in a bore hole, the method having: providing a source of power to a high power laser beam source located at a depth within a borehole, the high power laser beam source having a laser; thereby generating a laser beam having a wavelength of less than 810 nm; cooling the laser, wherein the cooling has sending a fluid into the borehole, the fluid having a temperature lower than an ambient temperature within the borehole at the depth of the high power laser source; providing within the borehole at the depth of the high power laser source a high power laser beam having at least 5 kW of power and a wavelength less than 810 nm; shaping the high power laser beam into a predetermined shape; and, directing the high power laser beam to a target within the borehole to perform a laser operation at the depth within the borehole.

Yet additionally, there is provided a high power laser source for generating high power beams in situ in a borehole, the laser source comprising: a downhole assembly having an outer housing, the outer housing defining a first cavity, a length and an axis; a cooling assembly in thermal contact with the first cavity: a semiconductor laser module assembly located in the first cavity, the semiconductor laser module assembly comprising: an outer wall defining a second cavity; a plurality of laser units located in the second cavity, each laser unit in thermal contact with the cooling assembly; each laser unit comprising a plurality of diode lasers; the laser diodes configured in the laser units, wherein the laser diodes are capable of generating a plurality of initial laser beamlets, wherein the initial laser beamlets from the laser units have substantially parallel beamlet paths and a spacing between the beamlet paths; the laser units configured in the second cavity, whereby the substantially parallel beamlet paths are directed toward a beam transformation system; the beam transformation system containing optics, wherein the beamlet paths are directed in a direction substantially parallel to the axis, and wherein the spacing between the beamlet paths is reduced; and, a focusing opitcs package, wherein an operation laser beam is formed.

There is also provided these high power laser sources and methods having one or more of the following features: wherein the laser beamlets from each laser unit have a total power of greater than 10 W, a wavelength from about 400 nm to about 900 nm, and an $M^2$ of less than 100; wherein the operational beam has a power of greater than 5 kW and an $M^2$ of less than 50; wherein the operational beam has a power of greater than 10 kW and an $M^2$ of less than 20; wherein the operational beam has a power of greater than 10 kW and an $M^2$ of less than 20, and a wavelength from about 400 nm to about 500 nm; wherein the operational beam has a power of greater than 10 kW and an $M^2$ of less than 20, and a wavelength from about 500 nm to about 600 nm; wherein the laser beamlets have a power of greater than 0.25 W, a wavelength from about 400 nm to about 900 nm, and an $M^2$ of less than 50; wherein the operational beam has a power of greater than 5 kW and an $M^2$ of less than 20; wherein the operational beam has a power of greater than 10 kW and an $M^2$ of less than 20; wherein the operational beam has a power of greater than 10 kW and an $M^2$ of less than 20, and a wavelength from about 400 nm to about 500 nm; wherein the operational beam has a power of greater than 10 kW and an $M^2$ of less than 20, and a wavelength from about 500 nm to about 600 nm; wherein the initial beamlet paths are substantially normal to the axis.

Yet further there is provided these laser systems, methods and sources having one or more of the following features: comprising a source of electrical power, wherein the electrical power source lowers an incoming voltage and increases an current to provide a transformed electrical power to the laser units; and comprising a source of electrical power, wherein the electrical power source lowers an incoming voltage and increases an current to provide a transformed electrical power supply to the laser units; wherein the incoming voltage is from about 400V to 1,000V and the incoming current is from about 40 A to 100 A; and the transformed electrical power supply has a voltage of from about 80V to 300V and a current of from about 80 A to 300 A.

Still further there is provided a system for generating a high power operational laser beam in situ in a borehole, the system comprising: a mobile field unit, the mobile field unit comprising a control unit, a cooling system, conveyance structure, the conveyance structure having a proximal end and a distal end; the conveyance structure, structure comprising a line structure, a cooling fluid delivery line, and an electrical power line; a downhole assembly in mechanical, fluid and electrical association with the distal end of the conveyance structure, whereby electrical power and cooling fluid can be supplied to the downhole assembly; the downhole assembly having an outer housing, the outer housing defining a first cavity, a length and an axis; a cooling assembly located in the first cavity, the cooling assembly having a cooling fluid flow channel, the fluid flow channel in fluid communication with the conveyance structure fluid delivery line; a semiconductor laser module assembly located in the first cavity, the semiconductor laser module assembly comprising: an outer wall defining a second cavity; a plurality of laser units located in the second cavity, each laser unit in thermal contact with the cooling assembly; each laser unit comprising a plurality of diode lasers; the laser diodes configured in the laser units, wherein the laser diodes are capable of generating a plurality of initial laser beamlets, wherein the initial laser beamlets from the laser units have substantially parallel beamlet paths and a spacing between the beamlet paths; the laser units configured in the second cavity, whereby the substantially parallel beamlet paths are directed toward a beam transformation system; the beam transformation system containing optics, wherein the beamlet paths are directed in a direction substantially parallel to the axis, and wherein the spacing between the beamlet paths is reduced; and, a focusing opitcs package, wherein an operation laser beam is formed.

Yet further there is provided these laser systems, methods and sources having one or more of the following features: wherein the laser beamlets from each laser unit have a total power of greater than 10 W, a wavelength from about 400 nm to about 900 nm, and an $M^2$ of less than 100; wherein the operational beam has a power of greater than 5 kW and an $M^2$ of less than 80; wherein the operational beam has a power of greater than 10 kW and an $M^2$ of less than 50; wherein the operational beam has a power of greater than 10 kW and an $M^2$ of less than 20, and a wavelength from about 400 nm to about 500 nm; wherein the operational beam has a power of greater than 10 kW and an $M^2$ of less than 20, and a wavelength from about 500 nm to about 600 nm; wherein the laser beamlets have a power of greater than 0.25 W, a wavelength from about 400 nm to about 900 nm, and an $M^2$ of less than 20; wherein the operational beam has a power of greater than 5 kW and an $M^2$ of less than 60; wherein the operational beam has a power of greater than 10 kW and an $M^2$ of less than 50; wherein the operational beam has a power of greater than 10 kW and an $M^2$ of less than 20, and a wavelength from about 400 nm to about 500 nm; wherein the operational beam has a power of greater than 10 kW and an $M^2$ of less than 20, and a wavelength from about 500 nm to about 600 nm; wherein the cooling system comprises an aqueous coolant, and has the capability to flow the coolant at a flow rate of at least about 2 gpm; wherein the cooling system comprises an aqueous coolant, and has the capability to flow the coolant at a flow rate of at least about 5 gpm; wherein the cooling system comprises an aqueous coolant, and has the capability to flow the coolant at a flow rate of at least about 2 gpm; wherein the cooling system comprises an aqueous coolant, and has the capability to flow the coolant at a flow rate of at least about 2 gpm.

Still further there is provided a method of generating a high power laser beam, the method comprising: providing electrical power to a plurality of laser units located in a borehole, each laser unit comprising a plurality of diode lasers; the laser units located in a cavity defined within a laser source assembly; the laser diodes generating a plurality of initial laser beamlents, wherein the initial laser beamlets from the laser units have substantially parallel beamlet paths and a spacing between the beamlets paths; transmitting the initial laser beamlets along the laser beamlet paths into a beam transformation system; the beam transforming system changing a direction of the initial laser beamlets; the beam transforming system reducing the spacing between the initial laser beamlets; cooling the laser units; whereby the laser units temperature during generation of the laser beamlets is kept below 80° C., forming an operational laser beam; directing the operational laser beam to a target in the borehole to perform a downhole laser operation.

BRIEF DESCRIPTION OF THE DRAWINGS

FIG. 1 is cross-sectional view of an embodiment of a deployed laser system in accordance with the present inventions.

FIG. 1A is a detailed prospective view of the embodiment of FIG. 1 of the in situ down hole laser generation tool in accordance with the present inventions.

FIG. 1B is a partial cross sectional view of the tool of FIG. 1A.

FIG. 1C is a cross sectional view of the tool of FIG. 1B taken along line C-C.

DESCRIPTION OF THE DRAWINGS AND THE PREFERRED EMBODIMENTS

Figure 2:
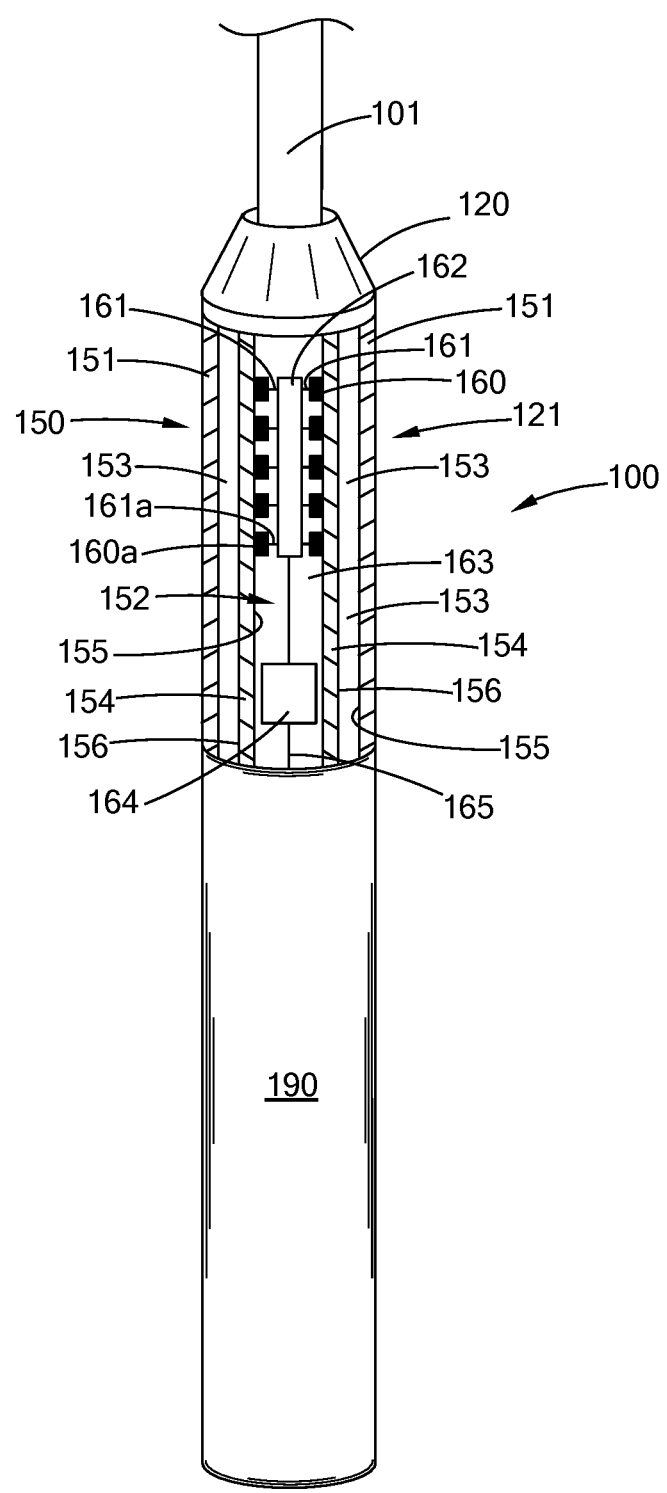
FIG. 2 is a partial cross sectional view of an embodiment of an in situ down hole laser tool in accordance with the present inventions.

In general, embodiments of the present inventions relate to, among other things, methods, apparatus and systems for use in laser drilling of a borehole in the earth, and further, relate to equipment, methods and systems for the laser advancing of such boreholes deep into the earth and at highly efficient advancement rates.

Further, in general, embodiments of the present inventions, by way of illustration, may find use in the generation, delivery, propagation and combinations and variations of these, of high power laser beams in difficult to access, harsh, remote, and extreme environments and conditions, such as the environments and conditions found, for example, in or associated with a borehole, in or associated with an exploration well, in or associated with a producing oil well, in or associated with a producing geothermal well, in or associated with a producing natural gas well, in or associated with a nuclear reactor, in the earth, in or associated with a pipe line, on the sea floor, in or associated with a mine, and under the surface of a body of water.

Moreover and in general, embodiments of the present inventions relate to diode lasers, diode laser configurations, diode laser systems, for the generation of laser beams in the 400 nm to 1,200 nm wavelengths.

Embodiments of the present laser diode systems can be incorporated into laser BOPs and laser BOP systems, with the laser system being located sub-sea, and preferably integral with the BOP. Examples of such laser BOPs are disclosed and taught in U.S. Pat. Nos. 8,720,584, 8,783,360, 8,720,575, and 8,783,361, the entire disclosures of each of which are incorporated herein by reference.

Embodiments of the present laser diode systems can be incorporated into down hole laser tools. Examples of such down hole tools are disclosed and taught in U.S. Pat. Nos. 8,511,401, 8,820,434, 8,826,973, 9,074,422, 9,719,302 and 9,562,395, the entire disclosures of each of which are incorporated herein by reference.

Embodiments of the present laser diode systems can be incorporated into laser decommissioning tools. Examples of such tools are disclosed and taught in U.S. Pat. Nos. 9,089,928, 9,492,885 and 9,664,012, the entire disclosures of each of which are incorporated herein by reference.

In general, and by way of further illustration, embodiments of the present inventions relate to methods, apparatus and systems for the delivery of high power laser beams to a work surface to perform a laser operation on the work surface, such as, treating, fracturing, tunneling, weakening, welding, annealing, cutting, removing, milling, completing, monitoring, analyzing, drilling, penetrating, melting, ablating, spalling, vaporizing, cooking, charring, heating, perforating and combinations and various of these. The work surfaces, for example, may be roads, the bottom of a borehole, the side wall of a borehole, a casing, a tubular, an interior surface of a tubular, an exterior surface of a tubular, a subsea structure, the earth, bridge supports, dams, meat, animal and human tissue, food products, ice, rocks, rock faces, pipes, conduit, tubes, columns, wire, cables, girders, beams, buildings, concrete, reinforced concrete, rebar, metal, coal, ore, shale, tar sands, mineral containing materials, steel, tanks, and support structures. Thus, the present inventions relate to high power laser systems, high power lasers, and laser-mechanical tools and tool systems, for example, that are capable of providing at least about 1 kW, at least about 5 kW, at least about 10 kW, at least about 20 kW, at least about 50 kW, and at least about 100 kW, from about 10 kW to about 50 kW, from about 20 kW to about 80 kW, from about 40 kW to about 100 kW, and greater and lesser powers, as well as all powers within these ranges, of laser power to a remote work surface or target material in harsh environmental conditions, which systems and units may include for example drilling, workover and completion, decommissioning, cleaning, mining, ROV, and pigging systems and units.

Thus, in general, and by way of further illustration, embodiments of the present inventions relate to methods, apparatus and systems for the delivery of high power laser beams to a work surface, and in particular, a work surface that may be on a factory floor, may be in remote, hazardous, optically occluded and difficult to access locations, such as: oil wells, boreholes in the earth, pipelines, underground mines, natural gas wells, geothermal wells, surface mines, subsea, nuclear reactors, or in other environments. Further and in general, the present inventions relate to high power laser systems, tools, process and operations that may be used with, as a part of, or in conjunction with, systems, methods and tools for applying laser energy for performing laser applications and laser assisted applications such as cutting, heat treating, thermal processing, annealing, cladding, hard facing, welding, advancing a borehole, workover and completion, removing material, monitoring, cleaning, controlling, assembling, drilling, machining, powering equipment, milling, flow assurance, decommissioning, plugging, abandonment and perforating.

In general, embodiments of the present inventions relate to systems, methods and tools for applying directed energy for cutting, heat treating, thermal processing, annealing, cladding, hard facing, welding and removing material; by way of an isolated laser beam that may be transmitted within a fluid laser jet. Further, and in particular, these inventions relate to laser processing of objects located downhole in a borehole, associated with a borehole, or located under a body of water and would include, for example, the cutting, milling, perforating, and sectioning of such objects, including the perforating of boreholes into and through casing, cement and formations. These inventions still further relate to the advancing of boreholes in the earth, for example sandstone, limestone, basalt, salt, granite, shale, or the advancing of boreholes in other materials, that may or may not be found in the earth, such as for example concrete. The present inventions further relate to such methods and apparatus for laser assisted milling, cutting, flow assurance, decommissioning, plugging, abandonment and perforating activities in the exploration, production and development of natural resources, such as minerals, oil, gas and geothermal.

An embodiment of the present invention relates to systems, apparatus and methods that, among other things, provide for the use of a laser source, in downhole environments to generate and propagate a laser beam downhole, i.e., in situ, in the borehole. Embodiments of these downhole laser systems, include for example, a semiconductor laser source, which, for example is an assembly of semiconductor lasers that provides, in situ, a laser beam having a wavelength from about 300 nm to about 900 nm, high brightness and high power.

An embodiment of the present invention relates to systems, apparatus and methods that, among other things, provide for the use of a laser source, in downhole environments to generate and propagate a laser beam downhole, i.e., in situ, in the borehole. Embodiments of these downhole laser systems, include for example, a semiconductor laser source, which, for example is an assembly of semiconductor lasers that provides, in situ, a laser beam having a wavelength from about 300 nm to about 1,100 nm, high brightness and high power.

An embodiment of the present invention relates to systems, apparatus and methods that, among other things, provide for the use of a laser source, in downhole environments to generate and propagate a laser beam downhole, i.e., in situ, in the borehole. Embodiments of these downhole laser systems, include for example, a semiconductor laser source, which, for example is an assembly of semiconductor lasers that provides, in situ, a laser beam having a wavelength from about 300 nm to about 1,500 nm, high brightness and high power.

Embodiments of these downhole semiconductor laser sources, for in situ generation of laser beams, include for example, an assembly of diode lasers, and preferably high brightness diode lasers, that provide a laser beam having a wavelength from 300 nm to 900 nm, having a wavelength from about 455 to about 810 nm, having a wavelength of less than about 900 nm, having a wavelength of less than about 800 nm, having a wavelength in the four-hundreds nm (i.e., 400 nm-499.999 nm, "400s" nm or "4XX" nm), having a wavelength in the 5XXs nm, and having a wavelength in the 8XXs nm, and also in the 6XXs nm, and 7XXs nm.

Embodiments of these downhole semiconductor laser sources, for in situ generation of laser beams, can have one, two three, four, tens, hundreds, and more individual semiconductor lasers, such as for example diode lasers. The individual, or single, laser beams from these semiconductor lasers can have BPP of less than 1,000 mm mrad (i.e., milliard), BPP of less than 500 mm mrad (i.e., milliard) BPP of less than 100 mm mrad (i.e., milliard), BPP of less than 50 mm mrad (i.e., milliard), less than 20 mm rad, less than 15 mm mrad, less than 10 mm mrad, less than 8 mm mrad, and less than 3 mm mrad. The individual, or single, laser beams from these semiconductor lasers can have an $M^2$ of less than about 200, an $M^2$ of less about 100, an $M^2$ of 50 or less, an $M^2$ of 3 or less, an $M^2$ of 2 or less, an $M^2$ of 1.5 or less, and an $M^2$ of 1.1 or less. The individual, or single, laser beams from these semiconductor lasers can have a power of at least about 1 W, at least about 10 W, at least about 100 W, and at least about 1,000 W.

Embodiments of these downhole semiconductor laser sources, for in situ generation of laser beams, can have one, two three, four, tens, hundreds, and more individual semiconductor lasers, such as for example diode lasers.

In embodiments of the downhole semiconductor laser sources, these individual initial laser beams are combined downhole, i.e. in situ beam combination, to form an operational laser beam. (An "initial downhole laser beam" or "initial laser beam" "beamlet" or "initial beam" is the first laser beam that is generated downhole by a downhole laser. An "operational laser beam" or "operational beam" is a downhole laser beam that has sufficient power to perform an intended laser operation and is directed along a laser beam path at a downhole target to perform the intended laser operation.) Although a single operational laser beam is preferred in many applications, in some applications one, two, three or more operational laser beams may be utilized and preferred.

The one, two, three, tens, or thousands of initial laser beams can be combined downhole, in a borehole.

Further, it should be noted that not all of the initial downhole laser beams need to be combined into an operation laser beam. Thus, one, two, three or more of the initial downhole laser beams can be used for applications other than performing a laser operation on a target, such other applications would include for example, monitoring, communications, or analysis. Additionally, it should be noted that a single initial laser beam may have sufficient power to function as an operational laser beam, and if utilized as such, would then be considered both an initial laser beam and an operation laser beam.

Embodiments of the operational laser beam, preferably have powers that are 1 kW and greater, 2 kW and greater, 10 kW and greater, 15 kW and greater, and 20 kW and greater, 40 kW and greater, 50 kW and greater, 80 kW and greater, and all powers with these ranges, as well as, greater and lesser powers. Embodiments of the operational laser beam preferably have high brightness and exceptionally high brightness (i.e., BPP of less than 10 mm mrad, $M^2$ of less than 1.5, or both). Embodiments of the operational laser beam preferably have BPP of 200 mm mrad or less, BPP of 100 mm mrad or less, 50 mm mrad or less, 15 mm mrad or less, 10 mm mrad or less, 8 mm mrad or less, and 3 mm mrad or less. Embodiments of the operational laser beam preferably have an $M^2$ of 1,000 or less, $M^2$ of 500 or less, $M^2$ of 200 or less, $M^2$ of 100 or less, $M^2$ of 50 or less, $M^2$ of 20 or less, $M^2$ of 10 or less, an $M^2$ of 5 or less, an $M^2$ of 3 or less, an $M^2$ of 2 or less, an $M^2$ of 1.5 or less, and an $M^2$ of 1.2 or less.

Embodiments of these downhole semiconductor laser sources, for in situ generation of laser beams, can increase the power of the initial laser beam while preserving brightness, more preferably, these laser sources can significantly increase laser power, with minimal effects on brightness. Thus, for example, the laser sources can increase the power of the initial laser beam by at least 10×, by at least 100×, and by at least 1000× or more through in situ beam combination and all increases with these ranges, as well as, greater and lesser increases. The laser sources can preserve brightness of the initial laser beams by having less than a 10% increase in $M^2$, less than a 20% increase in $M^2$, less than a 50% increase in $M^2$, and less than a 100% increase in $M^2$ from the in situ beam combination and all brightness preservations with these ranges, as well as, greater and lesser brightness preservations.

The high power laser may also be located near the laser tool, such as for example, when the tool and laser are associated with a remote operated vehicle ("ROV") or a laser PIG. In these embodiments the laser tools and assemblies can be located within the ROV, the ROV support structure, or can be in a laser tool, that is held or controlled by for example the ROV's manipulator arm. Laser ROVs and sub-sea laser operations are disclosed and taught in U.S. Pat. No. 9,080,425 the entire disclosure of which is incorporated herein by reference, and Laser PIGs are disclosed and taught in U.S. Pat. No. 9,138,786, the entire disclosure of which is incorporated herein by reference.

A high power laser source, e.g., the laser diode system, preferably incorporated into a laser down hole, laser perforating or laser decommissioning tool, may be conveyed into the wellbore by a conveyance structure, which preferably is a line structure, which may have multiple channels for transporting different materials, cables, electrical power lines, optical power lines, to the downhole tool, the laser source, the bore hole, and combinations and variations of these. The channels may be in, on, integral with, releasably connected to, or otherwise associated with the line structure, and combinations and variations of these. Further examples of conveyance structures are disclosed and taught in the following US Patent Application Publications: Publication No. US 2010/0044106, Publication No. 2010/0215326, Publication No. 2012/0020631 and Publication No. 2012/006086, the entire disclosures of each of which are incorporated herein by refernce. The fluid may be a gas, a foam, a supercritical fluid, or a liquid. The fluid may be used to cool the high power laser source, the high power optics, the motor, other sections, as well as to keep the laser beam path clear of debris, to remove or assist in removing cuttings and other material from the borehole, the bottom of the borehole or the work area, and other uses for downhole fluids known to the art. Typically, a liquid, for example water, may be used as a coolant.

Systems and methods may generally include one or more features to protect the laser. This becomes important because of the harsh environments, both for surface units and downhole units. Thus, in accordance with one or more embodiments, a borehole drilling system may include a cooling system. The cooling system may generally function to cool the laser. For example, the cooling system may cool a downhole laser, for example to a temperature below the ambient temperature or to an operating temperature of the laser. Further, the laser may be cooled using sorption cooling to the operating temperature of the diode laser, for example, for a diode laser from about 20° C. to about 100° C. For a fiber laser its operating temperature may be between about 20° C. to about 50° C. A liquid at a lower temperature may be used for cooling when a temperature higher than the operating diode laser or fiber laser temperature is reached to cool the laser.

Heat may also be sent uphole, i.e., out of the borehole and to the surface, by a liquid heat transfer agent. The liquid transfer agent may then be cooled by mixing with a lower temperature liquid uphole. One or multiple heat spreading fins may be attached to the laser diode to spread heat away from the diode laser. Fans may also be sued. Fluids may also be used as a coolant, while an external coolant may also be used.

In downhole applications the laser may be protected from downhole pressure and environment by being encased in an appropriate material. Such materials may include steel, titanium, diamond, tungsten carbide and the like. The fiber head for an diode laser or fiber laser may have a transmissive window. Such transmissive windows may be made of a material that can withstand the downhole environment, while retaining transmissive qualities. One such material may be undoped YAG, or sapphire or other material with similar qualities. One or more diode lasers or fiber lasers may be entirely encased by sapphire. By way of example, a diode laser, Raman laser or fiber laser may be made of diamond, tungsten carbide, steel, and titanium other than the part where the laser beam is emitted.

In the downhole environment it is further provided by way of example that the diode laser or fiber laser is not in contact with the borehole while drilling. For example, a downhole laser may be spaced from a wall of the borehole.

This distal, or remote, laser uses the laser energy from the transmission or first laser to create a lasing action, e.g., pump and thus generates a laser beam at a second wavelength (range of wavelengths). The remote laser is optically associated with a high power laser tool, which receives, shapes and configures this second laser beam for launching from the tool, through free space, toward a work surface or target material. This second wavelength provides for good, or preferably the optimum, ability to minimize losses, as the second laser beam is propagated through the free space medium, after being launched from the laser tool, to the target material or work surface.

The source of fluid may be either a gas, a liquid, a foam, or system having multiple capabilities. The fluid may serve many purposes in the advancement of the borehole. Thus, the fluid is primarily used for the removal of cuttings from the bottom of the borehole, for example as is commonly referred to as drilling fluid or drilling mud, and to keep the area between the end of the laser optics in the bottom hole assembly and the bottom of the borehole sufficiently clear of cuttings so as to not interfere with the path and power of the laser beam. It also may function to cool the laser optics and the bottom hole assembly, as well as, in the case of an incompressible fluid, or a compressible fluid under pressure. The fluid further provides a means to create hydrostatic pressure in the well bore to prevent influx of gases and fluids.

Thus, in selecting the type of fluid, as well as the fluid delivery system, consideration should be given to, among other things, the laser wavelength, the optics assembly, the geological conditions of the borehole, the depth of the borehole, and the rate of cuttings removal that is needed to remove the cuttings created by the laser's advancement of the borehole. It is highly desirable that the rate of removal of cuttings by the fluid not be a limiting factor to the systems rate of advancing a borehole. For example fluids that may be employed with the present invention include conventional drilling muds, water, and fluids that are transmissive to the laser. Preferably these fluids can be employed and preferred and should be delivered at rates from a couple to several hundred CFM at a pressure ranging from atmospheric to several hundred psi. If combinations of these fluids are used flow rates should be employed to balance the objects of maintaining the trasmissiveness of the optical path and removal of debris.

The efficiency of the laser's cutting action can also be determined by monitoring the ratio of emitted light to the reflected light. Materials undergoing melting, spallation, thermal dissociation, or vaporization will reflect and absorb different ratios of light. The ratio of emitted to reflected light may vary by material further allowing analysis of material type by this method. Thus, by monitoring the ratio of emitted to reflected light material type, cutting efficiency, or both may be determined. This monitoring may be performed uphole, downhole, or a combination thereof.

Moreover, for a variety of purposes such as powering downhole monitoring equipment, electrical power generation may take place in the borehole including at or near the bottom of the borehole. This power generation may take place using equipment known to those skilled in the art, including generators driven by drilling muds or other downhole fluids, means to convert optical to electrical power, and means to convert thermal to electrical power.

In some aspects, the material, such as a rock surface may be imaged by a camera downhole. Data received by the camera may be used to remove or displace the rock. Further spectroscopy may be used to determine the rock morphology, which information may be used to determine process parameters for removal of material.

In an embodiment, for example, the bottom hole assembly contains the laser, laser optics, the delivery means for the fluid and other equipment. In general the bottom hole assembly preferably contains the optics for directing the laser beam to the earth or rock to be removed for advancing the borehole, or the other structure intended to be cut.

The present systems and in particular the bottom hole assembly, may include one or more optical manipulators. An optical manipulator may generally control a laser beam, such as by directing or positioning the laser beam to spall material, such as rock. In some configurations, an optical manipulator may strategically guide a laser beam to spall material, such as rock. For example, spatial distance from a borehole wall or rock may be controlled, as well as the impact angle. In some configurations, one or more steerable optical manipulators may control the direction and spatial width of the one or more laser beams by one or more reflective mirrors or crystal reflectors. In other configurations, the optical manipulator can be steered by an electro-optic switch, electroactive polymers, galvonometers, piezo-electrics, and/or rotary/linear motors. In at least one configuration, a diode laser or fiber laser optical head may generally rotate about a vertical axis to increase aperture contact length. Various programmable values such as specific energy, specific power, pulse rate, duration and the like maybe implemented as a function of time. Thus, where to apply energy may be strategically determined, programmed and executed so as to enhance a rate of penetration and/or laser/rock interaction, to enhance the overall efficiency of borehole advancement, and to enhance the overall efficiency of borehole completion, including reducing the number of steps on the critical path for borehole completion. One or more algorithms may be used to control the optical manipulator.

In general, embodiments of the laser bottom hole assembly (LBHA) or bottom hole assembly (BHA) which terms are to be used interchangeable, unless specifically provided otherwise, may contain an outer housing that is capable of withstanding the conditions of a downhole environment, a source of a high power laser beam, and optics for the shaping and directing a laser beam on the desired surfaces of the borehole, casing, or formation. The high power laser beam may be greater than about 1 kW, from about 2 kW to about 20 kW, greater than about 5 kW, from about 5 kW to about 100 kW, at least about 10 kW, at least about 20 kW, at least about 40 kW and at least about 60 Kw, and all powers with these ranges, as well as, greater and lesser powers. The assembly may further contain or be associated with a system for delivering and directing fluid to the desired location in the borehole, a system for reducing or controlling or managing debris in the laser beam path to the material surface, a means to control or manage the temperature of the optics, a means to control or manage the pressure surrounding the optics, and other components of the assembly, and monitoring and measuring equipment and apparatus, as well as, other types of downhole equipment that are used in conventional mechanical drilling operations. Further, the BHA may incorporate a means to enable the optics to shape and propagate the beam which for example would include a means to control the index of refraction of the environment through which the laser is propagating. Thus, as used herein the terms control and manage are understood to be used in their broadest sense and would include active and passive measures as well as design choices and materials choices.

The LBHA and optics, in at least one aspect, can provide that a beam spot pattern and continuous beam shape may be formed by a refractive, reflective, diffractive or transmissive grating optical element. Refractive, reflective, diffractive or transmissive grating optical elements may be made, but are not limited to being made, of fused silica, quartz, ZnSe, Si, GaAs, YAG, polished metal, sapphire, and/or diamond. These may be, but are not limited to being, optically coated with the said materials to reduce or enhance the reflectivity.

In accordance with one or more aspects, one or more refractive lenses, diffractive elements, transmissive gratings, and/or reflective lenses may be added to focus, scan, and/or change the beam spot pattern from the beam spots emitting from the fiber optics that are positioned in a pattern. One or more refractive lenses, diffractive elements, transmissive gratings, and/or reflective lenses may be added to focus, scan, and/or change the one or more continuous beam shapes from the light emitted from the beam shaping optics. A collimator may be positioned after the beam spot shaper lens in the transversing optical path plane. The collimator may be an aspheric lens, spherical lens system composed of a convex lens, thick convex lens, negative meniscus, and bi-convex lens, gradient refractive lens with an aspheric profile and achromatic doublets. The collimator may be made of the said materials, fused silica, ZnSe, SF glass, YAG, or a related material. The collimator may be coated to reduce or enhance reflectivity or transmission. Said optical elements may be cooled by a purging liquid or gas.

In some aspects, the one or more fiber optics with one or more said optical elements and beam spot lens shaper lenses may be steered in the z-direction to keep the focal path constant and rotated by a stepper motor, servo motors, piezoelectric motors, liquid or gas actuator motor, and electro-optics switches. The z-axis may be controlled by the drill string or mechanical standoff. The steering may be mounted to one or more stepper rails, gantry's, gimbals, hydraulic line, elevators, pistons, springs. The one or more fiber optics with one or more fiber optics with one or more said beam spot shaping lens and one or more collimator's may be rotated by a stepper motor, servo motors, piezoelectric motors, liquid or gas actuator motor, and electro-optic switch. The steering may be mounted to one or more stepper rails, gantry's, gimbals, hydraulic line, elevators, pistons, springs.

In some aspects, the fiber optics and said one or more optical elements lenses and beam shaping optics may be encased in a protective optical head made of, for example, the materials steel, chrome-moly steel, steel cladded with hard-face materials such as an alloy of chromium-nickel-cobalt, titanium, tungsten carbide, diamond, sapphire, or other suitable materials known to those in the art which may have a transmissive window cut out to emit the light through the optical head.

In accordance with one or more aspects, a laser source may be coupled to a plurality of optical fiber bundles with the distal end of the fiber arranged to combine fibers together to form bundle pairs, such that the power density through one fiber bundle pair is within the removal zone, e.g., spallation or vaporization zone, and one or more beam spots illuminate the material, such as rock with the bundle pairs arranged in a pattern to remove or displace the rock formation.

In accordance with one or more aspects, the pattern of the bundle pairs may be spaced in such a way that the light from the fiber bundle pairs emerge in one or more beam spot patterns that comprise the geometry of a rectangular grid, a circle, a hexagon, a cross, a star, a bowtie, a triangle, multiple lines in an array, multiple lines spaced a distance apart non-linearly, an ellipse, two or more lines at an angle, or a related shape. The pattern of the bundle pairs may be spaced in such a way that the light from the fiber bundles emerge as one or more continuous beam shapes that comprise above geometries. A collimator may be positioned at a said distance in the same plane below the distal end of the fiber bundle pairs. One or more beam shaping optics may be positioned at a distance in the same plane below the distal end of the fiber bundle pairs. An optical element such as a non-axis-symmetric lens may be positioned at a said distance in the same plane below the distal end of the fiber bundle pairs. Said optical elements may be positioned at an angle to the rock formation and rotated on an axis.

In accordance with one or more aspects, the distal fiber end made up of fiber bundle pairs may be steered in the X, Y, Z, planes and rotationally using a stepper motor, servo motors, piezoelectric motors, liquid or gas actuator motor. The distal fiber end may be made up of fiber bundle pairs being steered with a collimator or other optical element, which could be an objective, such as a non-axis-symmetric optical element. The steering may be mounted to one or more mechanical, hydraulic, or electro-mechanical element to move the optical element. The distal end of fiber bundle pairs, and optics may be protected as described above. The optical fibers may be single-mode and/or multimode. The optical fiber bundles may be composed of single-mode and/or multimode fibers.

It is readily understood in the art that the terms lens and optic(al) elements, as used herein is used in its broadest terms and thus may also refer to any optical elements with power, such as reflective, transmissive or refractive elements, In some aspects, the optical fibers may be entirely constructed of glass, hollow core photonic crystals, and/or solid core photonic crystals. The optical fibers may be jacketed with materials such as, polyimide, polyamide, acrylate, carbon polyamide, or carbon/dual acrylate. Light may be sourced from a diode laser, disk laser, chemical laser, fiber laser, or fiber optic source is focused by one or more positive refractive lenses.

In at least one aspect, the positive refractive lens types may include, a non-axis-symmetric optic such as a plano-convex lens, a biconvex lens, a positive meniscus lens, or a gradient refractive index lens with a plano-convex gradient profile, a biconvex gradient profile, or positive meniscus gradient profile to focus one or more beams spots to the rock formation. A positive refractive lens may be comprised of the materials, fused silica, sapphire, ZnSe, YAG, or diamond. Said refractive lens optical elements can be steered in the light propagating plane to increase/decrease the focal length. The light output from the fiber optic source may originate from a plurality of one or more optical fiber bundle pairs forming a beam shape or beam spot pattern and propagating the light to the one or more positive refractive lenses.

In some aspects, the refractive positive lens may be a microlens. The microlens can be steered in the light propagating plane to increase/decrease the focal length as well as perpendicular to the light propagating plane to translate the beam. The microlens may receive incident light to focus to multiple foci from one or more optical fibers, optical fiber bundle pairs, fiber lasers, diode lasers; and receive and send light from one or more collimators, positive refractive lenses, negative refractive lenses, one or more mirrors, diffractive and reflective optical beam expanders, and prisms.

In some aspects, a diffractive optical element beam splitter could be used in conjunction with a refractive lens. The diffractive optical element beam splitter may form double beam spots or a pattern of beam spots comprising the shapes and patterns set forth above.

In at least one aspect, the positive refractive lens may focus the multiple beam spots to multiple foci, to remove or displace the rock formation.

In accordance with one or more aspects, a collimator lens may be positioned in the same plane and in front of a refractive or reflective diffraction beam splitter to form a beam spot pattern or beam shape; where a beam expander feeds the light into the collimator. The optical elements may be positioned in the X, Y, Z plane and rotated mechanically.

In accordance with one or more aspects, the laser beam spot to the transversing mirror may be controlled by a beam expander. The beam expander may expand the size of the beam and send the beam to a collimator and then to a scanner of two mirrors positioning the laser beam in the XY, YZ, or XZ axis. A beam expander may expand the size of the beam and send the beam to a collimator, then to a diffractive or reflective optical element, and then to a scanner of two mirrors positioning the laser beam in the XY, YZ, or XZ axis. A beam expander may expand the size of the beam and send the beam to a beam splitter attached behind a positive refractive lens, that splits the beam and focuses it, to a scanner of two mirrors positioning the laser beam in the XY, YZ, or XZ axis.

In at least one aspect, a gas or liquid purge is employed. The purge gas or liquid may remove or displace the cuttings, rock, or other debris from the borehole. The fluid temperature may be varied to enhance rock removal, and provide cooling.

The following examples are provided to illustrate various embodiments of laser systems, laser operations, and downhole semiconductor laser sources of the present inventions. These examples are for illustrative purposes and should not be viewed as, and do not otherwise limit the scope of the present inventions.

EXAMPLE 1

Turning to FIG. 1 there is shown cross sectional view of a borehole 102 having a well head 104, a BOP 105 and a diverter 106, or other assembly to maintain pressure and handle the return of drilling fluids to the surface 103. Conveyance structure 101, which may be a line structure, is shown extending into the borehole 102 and down to and being connected with an embodiment of downhole drilling tool 100 that contains an in situ high power laser source 150.

There is also a whipstock 109 and casing 108 in the borehole, and the borehole has been advanced in a primarily horizontal direction from the general location of the whipstock 109 in the borehole 108. The conveyance structure 101 would be connected to a drilling unit, workover and completion unit, or similar type of unit (not shown in this drawing).

FIG. 1A shows a more detailed perspective view of the drilling tool 100 and sets forth its general components. It being recognized that additional general components may be added or used and that, applying the teachings of this specification, the order and arrangement of these components may be varied, without departing from the spirit of the inventions.

In FIG. 1A, the drilling tool 100 has a conveyance structure 101 in mechanical, and fluid communication with an upper section 121 by way of a conveyance structure connecter 120. The upper section 121 contains the high power laser source 150. The upper section 121 is connected to the motor section 122, below the motor section is a lower motor section 123, and below the lower motor section 123 is a laser-mechanical bit 124. Details of embodiments of the motor section, the lower motor section, and the laser-mechanical bit, for example, are disclosed and taught in U.S. Pat. No. 9,074,422, the entire disclosure of which is incorporated herein by reference.

In FIG. 1B there is shown the tool 100, with the upper section 121 shown in cross section revealing a schematic of an embodiment of the high power laser source 150. The high power laser source 150 has an outer wall 151 that forms a part of the tool 100 body, and the upper section 121 body. The outer wall 151 forms a high power laser source cavity 152. Within cavity 152, laser array wall 154 and outer wall 151 form a cooling fluid channel 153, through which the cooling fluid flows. It being understood that the channel 153 could be a series of tubes, radiator configuration, or any other configuration for the cooling fluid to have heat transferred to it, preferably in an efficient manner, from the lasers. Further, and preferably, there will also be pressure and flow management devices to control cooling fluid pressure, flow rate and both. (It is understood that other flow channels may be present, for example, to cool optics packages, keep the laser beam path clear to the target, and for the removal of cutting to name a few.)

The laser array wall 154 has an outer surface 156, which is in fluid and thermal contact with the cooling fluid and forms the inner surface of the cooling fluid channel 153. The laser array wall 154 has an inner surface 155, which supports the semiconductor laser, e.g. 160, 160a. In this schematic 10 semiconductor lasers are shown, it being understood that the semiconductor lasers are distributed around the entirety of the inner circumference of the array wall 154. Thus, in this embodiment there are 6 more rows of semiconductor lasers (5 for each row), not shown.

In this embodiment the laser array wall 154 is tubular forming a circular inner surface 155. It being understood that the laser array wall 154 can be square, pentagon, hexagon, or any other multifaceted structure, to support the semiconductor laser, and position them in an advantageous manner.

The semiconductor lasers, e.g., 160, 160a, in this embodiment are arrays of diode lasers, with each diode laser emitting an initial laser beam along an initial laser beam path, e.g., 161, 161a, having a wavelength of 450 nm. Only a single line, e.g., 161, 161a, is shown, as the laser beam, and the beam path, to simplify the drawing, it being understood that there will be multiple initial laser beams, and beam paths, from each semiconductor laser. The diode lasers are mounted on a heat sink, which in turn is in thermal communication with the wall 154. Thus, each semiconductor laser, e.g., 160, emits a group (10, 20, 30, 100, or more) of initial laser beams having a collective (each beam power added together) power of 250 W.

The initial laser beams are directed to an optics assembly 162 (this assembly is also referred to as a beam transformation system or BTS). The optics assembly redirects the initial lasers beams so that their beam paths are parallel with the axis 170 of the tool 100. At this point the optics assembly 162 can also begin to process the initial laser beams, e.g., shapes, collimates, focuses, collimates the fast axis, collimates the slow axis, adjusts beam packaging (to preferably reduce spacing between the beams), combines the beams, and combinations and variations of these.

The laser beam or beams exit the optics assembly 162 and travel along beam path 163, which is parallel to, and preferably coaxial with, the tool axis 170, to an optics package 164. The optics package 164 further processes the laser beams, e.g., shapes, collimates, focuses, collimates the fast axis, collimates the slow axis, adjusts beam packaging (to preferably reduce spacing between the beams), combines the beams, and combinations and variations of these. For example, the optics package 164, can be any one of the optics packages disclosed and taught in U.S. Pat. Nos. 8,246,617, 8,826,973, 9,074,422 and in US Patent Publication No. 2012/0275159.

An operational laser beam, having theoretically about 10,000 W, of power leaves the optics package 164 and travels along beam path 165, (i.e., operations laser beam along the operational laser beam path), which is coaxial with the tool axis 170, to its intended target, which in this case is the bottom of a bore hole.

Preferably the array wall 154 supports or contains the electric power lines for providing electric power to the semiconductor lasers.

In longer distances, greater depth applications, such as more than 1,000 ft, more than 5,000 ft, more than 10,000 ft and more than 20,000 ft, it is preferable, to transmit the electricity from the surface as high voltage low current, and then transform that electricity downhole (i.e. in situ) to low voltage high current, which is typically what is required for the operation of the semiconductor lasers. Thus, a power transformer can be present in upper section 121, in conveyance structure connecter 120, or in another assembly located proximal (e.g. above) or distal (e.g., below) to the high power laser source 150.

In FIG. 1C there is shown a schematic of a cross section, taken along line C-C in FIG. 1B of the conveyance structure, which has paths for conveying or transmitting electrical power 180, cooling fluid 181, and working fluid 182.

EXAMPLE 2

The high power laser source 150, of Example 1, can be used as the high power laser source for offshore decommissioning, abandonment, cutting and other offshore laser operations. Thus, as illustrated in the schematic drawing of FIG. 2, the conveyance structure 101, the connector 120, and the upper section 121 of the tool 100 of Example 1 is configured with and mechanically and optically connected, and integrated with a high power laser tool decommissioning tool or assembly 190, of the type disclosed and taught in U.S. Pat. No. 9,089,928, the entire disclosure of which is incorporated herein by reference. It being noted that the high power laser source 150, can also be located within, distally, or proximally to the assembly 190. The high power laser source 150 can provide the source of high power laser energy, e.g., the laser beam to perform any and all of the laser operations disclosed and taught in U.S. Pat. No. 9,089,928. Additionally, the high power laser source 150 can be located near to tool 190 and optically connected to tool 190 by way of a high power optical fiber that transmits beam 165 from section 121 to tool 190.

EXAMPLE 3

Figure 3:
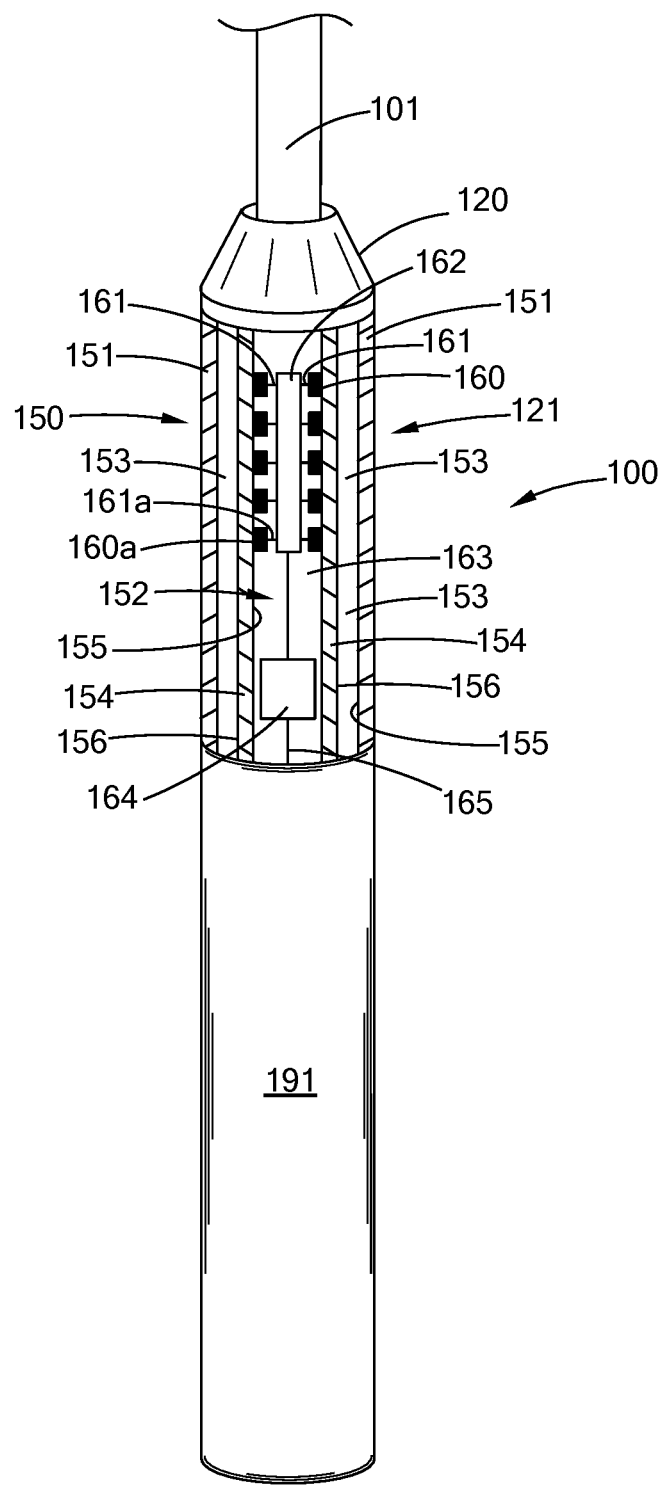
FIG. 3 is a partial cross sectional view of an embodiment of an in situ down hole laser tool in accordance with the present inventions.

The high power laser source 150, of Example 1, can be used as the high power laser source for laser operations with laser cutting tools and laser jets. Thus, as illustrated in the schematic drawing of FIG. 3, the conveyance structure 101, the connector 120, and the upper section 121 of the tool 100 of Example 1 is configured with and mechanically and optically connected, and integrated with thea high power laser tool or assembly 191 disclosed and taught in US Patent Publication No. 2012/0074110, the entire disclosure of which is incorporated herein by reference. It being noted that the high power laser source 150 can also be located within, distally, or proximally to the tools and assemblies 190. The high power laser source 150 can provide the source of high power laser energy, e.g., the laser beam to perform any and all of the laser operations disclosed and taught in US Patent Publication No. 2012/0074110. Additionally, the high power laser source 150 can be located near to tool 191 and optically connected to tool 191 by way of a high power optical fiber that transmits beam 165 from section 121 to tool 191.

EXAMPLE 4

Figure 4:
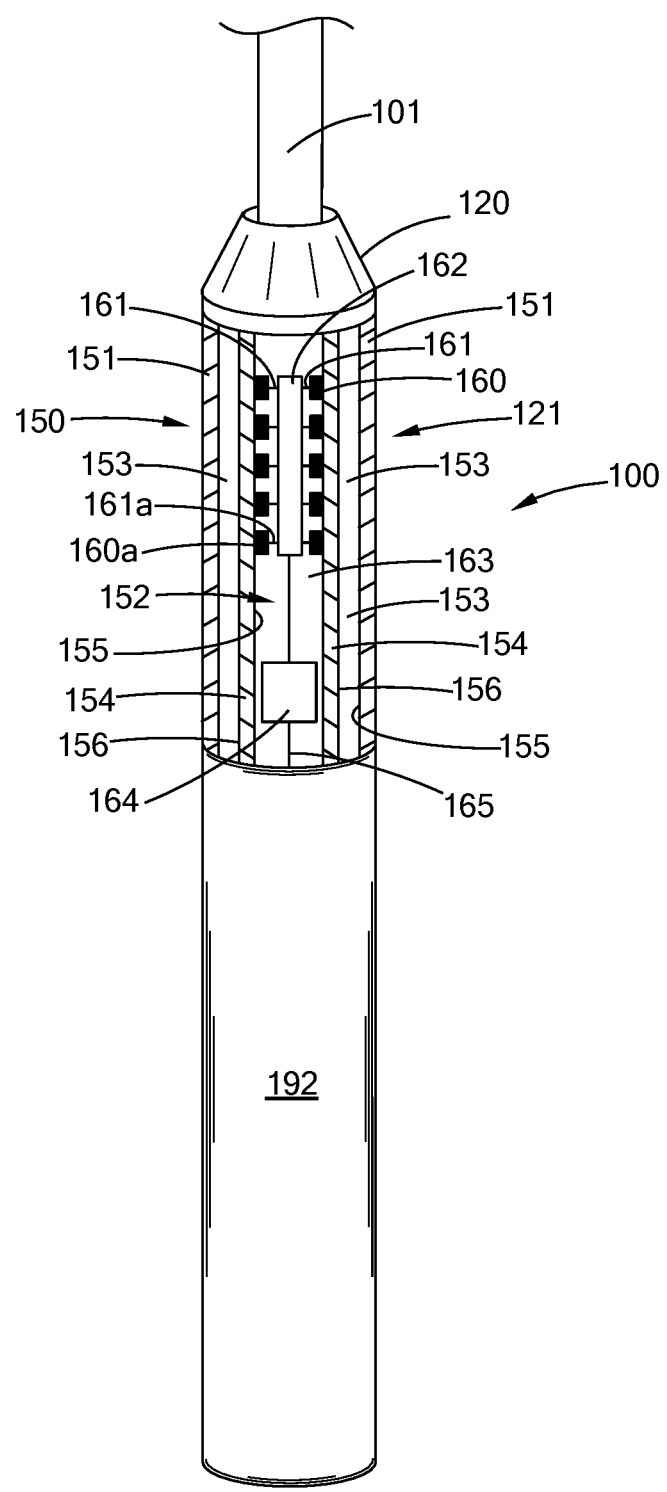
FIG. 4 is a partial cross sectional view of an embodiment of an in situ down hole laser tool in accordance with the present inventions.

The high power laser source 150, of Example 1, can be used as the high power laser source for laser downhole laser perforating and fracturing operations with laser perforating and fracturing tools. Thus, as illustrated in the schematic drawing of FIG. 4, the conveyance structure 101, the connector 120, and the upper section 121 of the tool 100 of Example 1 is configured with and mechanically and optically connected, and integrated with the high power laser tool or assembly 192, which is of the type disclosed and taught in US Patent Publication No. 2013/0228372 and Publication No. 2015/0129203, the entire disclosure of each of which is incorporated herein by reference. It being noted that the high power laser source 150, can also be located within, distally, or proximally to the tools and assemblies 192. The high power laser source 150 can provide the source of high power laser energy, e.g., the laser beam to perform any and all of the laser operations disclosed and taught in US Patent Publication No. 2013/0228372 and Publication No. 2015/0129203. Additionally, the high power laser source 150 can be located near to tool 192 and optically connected to tool 192 by way of a high power optical fiber that transmits beam 165 from section 121 to tool 192.

EXAMPLE 5

The high power laser source 150, of Example 1, can be used as the high power laser source for laser flow assurance with laser flow assurance tools and systems. Thus, the upper section 121 of the tool 100 of Example 1 is configured with and mechanically and optically connected, and integrated with the high power laser tool or assembly of the type disclosed and taught in US Patent Application Publication No. 2016/0251940, the entire disclosure of which is incorporated herein by reference. The high power laser source 150 can provide the source of high power laser energy, e.g., the laser beam to perform any and all of the laser operations disclosed and taught in US Patent Application Publication No. 2016/0251940. Additionally, the high power laser source 150 can be located near to tool and optically connected to tool by way of a high power optical fiber that transmits the operation beam from section 121 to the tool.

EXAMPLE 6

The high power laser source 150, of Example 1, can be used as the high power laser source for land based laser decommissioning and abandonment with laser decommissioning and abandonment tools. Thus, the conveyance structure 101, the connector 120, and the upper section 121 of the tool 100 of Example 1 is configured with and mechanically and optically connected, and integrated with the high power laser tool or assembly of the type disclosed and taught in US Patent Publication No. 2014/0190949, the entire disclosure of which is incorporated herein by reference. It being noted that the high power laser source 150, can also be located within, distally, or proximally to the tool. The high power laser source 150 can provide the source of high power laser energy, e.g., the laser beam to perform any and all of the laser operations disclosed and taught in US Patent Publication No. 2014/0190949. Additionally, the high power laser source 150 can be located near to tool and optically connected to tool by way of a high power optical fiber that transmits the operational beam 165 from section 121 to the tool.

EXAMPLE 7

The high power semiconductor laser sources of the present inventions, including for example the high power laser source 150 of Example 1, can be used as, incorporated into, or provide the high power laser beam for pressure containment vessels and activities disclosed and taught in US Patent Publication Nos. 2014/0069896 and 2014/0000902, and U.S. Pat. Nos. 8,750,584, 8,783,360, 8,684,088 and 8,783,361, the entire disclosures of each of which are incorporated herein by reference.

EXAMPLE 8

The high power semiconductor laser sources of the present inventions, including for example the high power laser source 150 of Example 1, can be used as, incorporated into, or provide the high power laser beam for the laser tools, bent subs, and activities disclosed and taught in U.S. Pat. No. 9,074,422, the entire disclosure of each of is incorporated herein by reference.

EXAMPLE 9

Figure 5A:
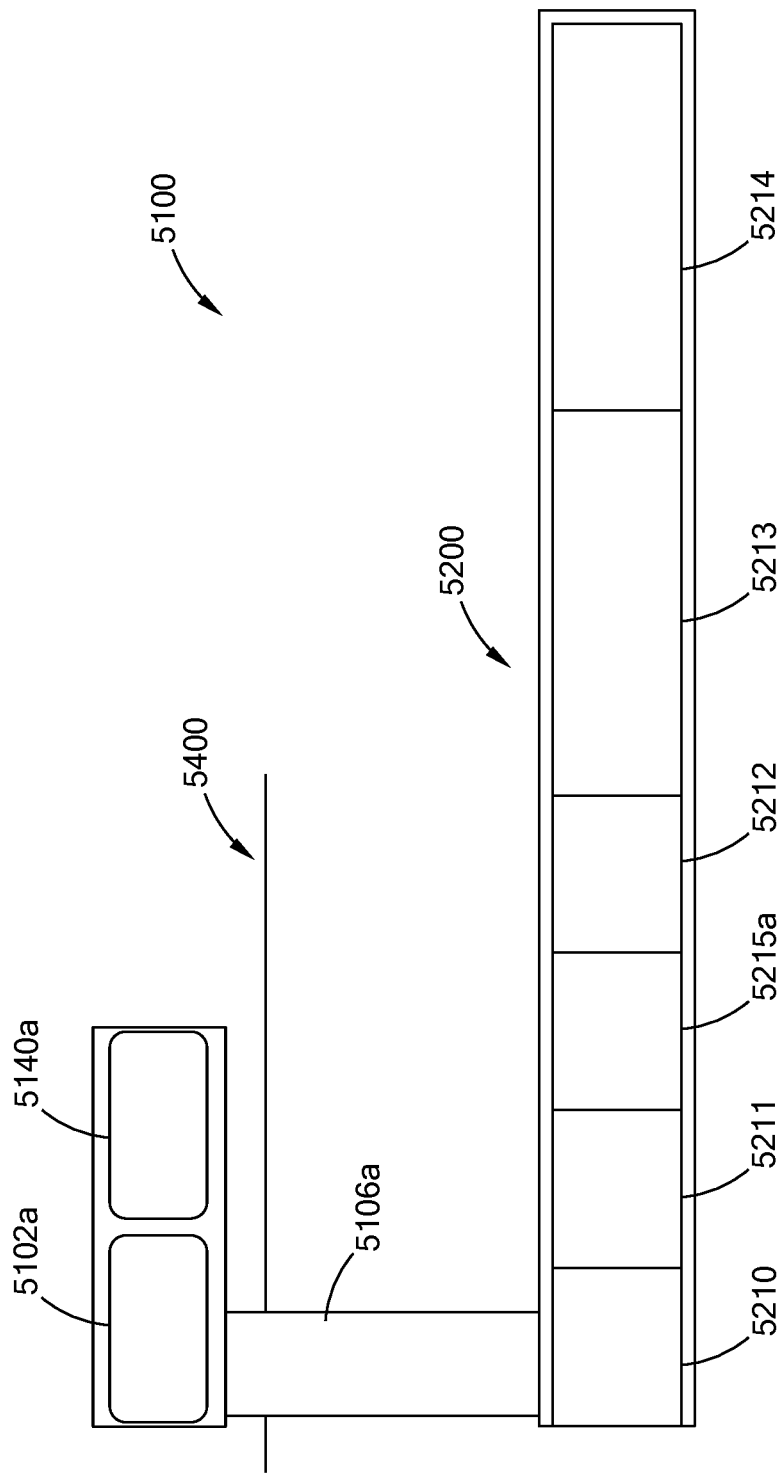
FIG. 5A is a schematic diagram of an embodiment of a laser system in accordance with the present inventions.
Figure 5B:
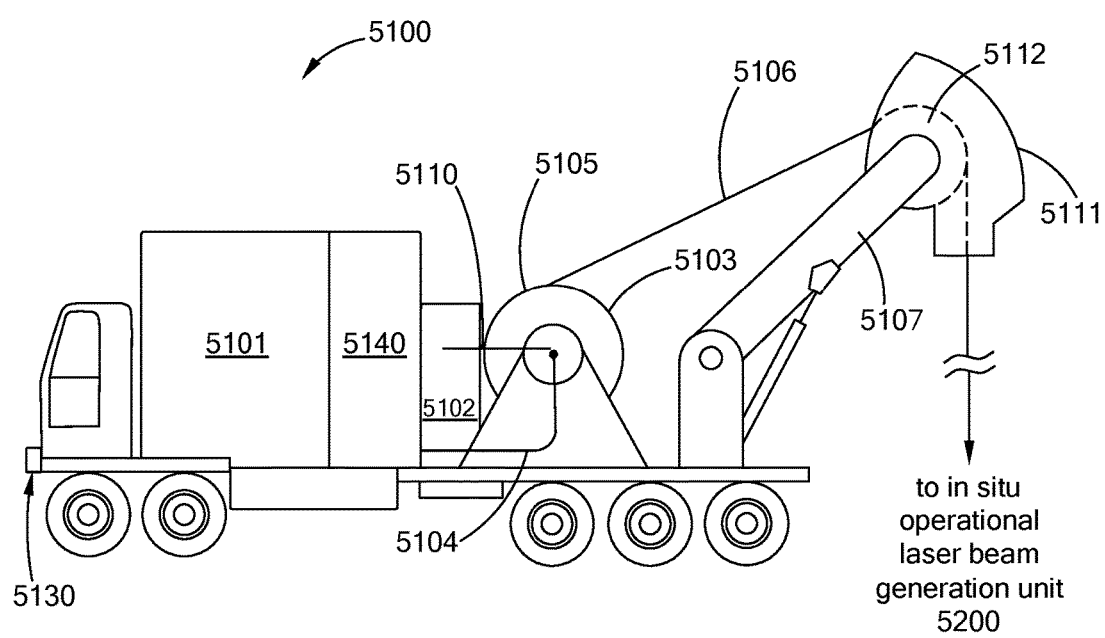
FIG. 5B is a detailed perspective view of an embodiment of a filed unit of the system of FIG. 5A.

Turning to FIG. 5A there is a block diagram of an embodiment of a system 5100 of the present invention for in situ generation of laser beams; and in FIG. 5B there is a side view of an embodiment of a mobile deployment unit 5130, of the system 5100.

Turning to the block schematic of FIG. 5A, there is a generator 5102a, a water system 5140a, and a conveyance system 5106a, which are above the surface 5400 of the earth. The down hole in situ operational laser beam generation unit 5200, for down hole laser beam generation has an interface 5210, a power converter 5211, a heat exchanger 5215a, a motor, telemetry and electrons section 5212, a high power laser source 5213, (e.g., diode array providing operation laser beam), and an optics package 5214. The down hole assembly 5200 is optically connected to an operational section (not shown), e.g., laser cutting head, laser drilling bit, etc.

In FIGS. 5A and 5B there is provided an embodiment of a mobile high power laser beam delivery system 5100 for use with a high power laser semiconductor laser source for in situ general of high power laser beams in the near IR, visual and near UV wavelengths, e.g., 300 nm to 900 nm, and most preferably in the 4XXs nm and 5XXs nm wavelengths. In the embodiment there is a control room 5101, a chiller and water system 5140, and a source of electrical power 5102, e.g. a generator. Cooled cooling water leaves the chiller water system 5140 via line 5104 and enters electrical-fluid slip ring assembly 5103. Electrical power (high voltage, low current) is transmitted from the generator 5012 via power line 5110 to the electrical-fluid slip ring assembly 5103. The assembly 5103 is mounted in spool 5105 that holds a conveyance structure 5016 that contains or is mechanically associated with a line for the cooling fluid and a line to transmit the electricity. (It being understood that a separate generator, not on the truck may be employed, and in some configurations may be preferable to reduce or eliminate vibration, noise, and to reduce the overall foot print or area of the unit 5130.) The conveyance structure 5106 is a line structure, e.g. a coil tube, wireline or composite tube having the electrical line and cooling fluid line contained in it, built into its side wall, wrapped around its wall, or otherwise mechanically associated with, or a part of, the line structure.

The conveyance device 5106 is associated with injector 5111 for advancing and retrieving the conveyance device, which injector is associated with a handling device 5107. Within the injector 5111 there is a path of travel 5112 that has a radius of curvature when the conveyance device 5106 is run through the injector 5111.

In general, and by way of example the control room may contain control systems and networks, such as for example those disclosed and taught in U.S. Pat. No. 9,138,786 the entire disclosures of which is incorporated herein by reference, and preferably is in control communication with the components of the system 5100.

It being noted that the injector may not be required in some situations, such as vertical well bores and where a downhole tractor is used, by way of example. Thus, the in situ operational laser beam generation unit 5200 may be advanced by its own weight, the weight of drill collars, or a tractor section from a reel and retrieved by winding the line structure 5106 back onto the reel.

EXAMPLE 10

Figures 6A, 6B:
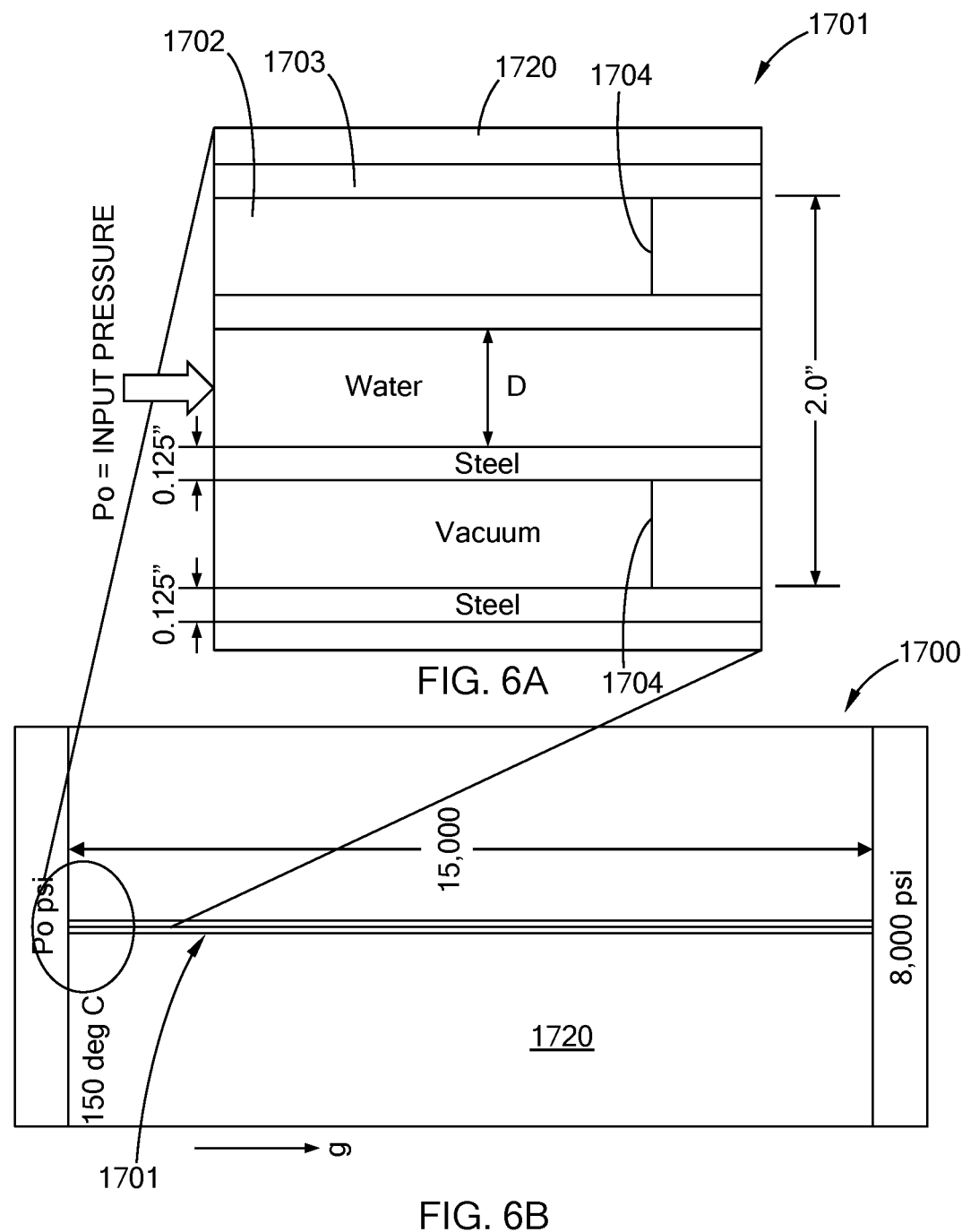
FIG. 6A is a detailed cross section of an embodiment of a coneveyance line in accordance with the present inventions.
FIG. 6B is a cross sectional schematic view of the deployed line of FIG. 6A in accordance with the present inventions.

Generally, laser diodes can generate a substantial amount of waste heat. Many currently available laser diodes in the blue and green color ranges (e.g. about 440 nm to about 550 nm) are about 30% efficient in converting electrical energy to optical energy, i.e., the laser beam. The remaining energy is converted into waste heat, which should be managed. Thus, for example diode laser that generate a 10 kW 450 nm laser beam will produce about 30 kW of waste heat. This heat needs to be removed from the laser diodes. In general, during operation, these types of diodes should be kept at below about 80° C., preferably below 70° C., and more preferably should be kept at about 25° C. to about 30° C., and thus should be keep in the temperature range of about 80° C. to about 25° C., about 60° C. to about 30° C., about 60° C. to about 25° C., about 40° C. to about 25° C., and any temperature within those ranges, as well as, lower and slightly higher temperatures. To remove this waste heat and keep the laser diodes operating in their preferred, e.g., optimal, range an insulated cooling fluid conveyance line can be used. Turning to FIGS. 6A and 6B (FIG. 6A is an enlargement of the section of FIG. 6B as shown by the lines connecting the figures) there are schematics of an embodiment of a vacuum insulated cooling fluid conveyance line structure 1700. The line structure 1700 has an inner tube 1701 for carrying a cooling fluid, e.g., water. Centralizers 1704, which are thermally insulative are used to keep the inner tube centered in the line structure 1700. An annulus 1702 maintains a vacuum that thermally insulates the inner tube 1701 from the outer wall 1703 of the line structure 1700. In a typical well that is 15,000 ft deep, can have an average external temperature (of the borehole environment 1720), i.e., the equilibrated temperature of the outer wall 1703 of about 150° C. Flowing water at 0° C. at the proximal end of the line structure 1700 permits it to exit the distal end at a sufficiently cool temperature to remove the 30 kW of waste heat generated by the laser diodes.

Water flow rates of about 2 gpm (gallons per minute), about 10 gpm, about 40 gpm, from 2 gpm to 50 gpm, from about 5 gpm to about 30 pgm and more can be used as cooling fluid flow rates, depending upon the diameter of the cooling fluid tube, and the cooling fluid. Friction reducers can be added to the cooling fluid to reduce heat generation from the cooling fluid flowing in the cooling fluid tube. It is contemplated that other types of thermal insulation can be used in the annulus 1702.

Additionally, generally the optics assembly (e.g., BTS) and the optics package are sealed at atmospheric pressure. This is a substantially lower pressure than is present at the bottom of a borehole (e.g., 15,000 ft borehole can have, for example, 8,000 psi pressure), this pressure barrier will also serve to provide cooling and waste heat management.

This cooling system can be used with embodiments of Examples 1-9, among other embodiments.

EXAMPLE 11

Diode lasers typically produce complex, highly asymmetric laser beams. The optics assemblies, e.g., the BTSs, process these raw laser beams from the diode laser. The BTS generally can circularize the laser beams, and reduce and if need be, eliminate empty space between the individual raw laser beams, e.g., the beamlets.

In some embodiments the raw laser beams, e.g., the beamlets do not need to be circularized, and only the empty space needs to be eliminated. In other embodiments, the beamlets are circularized and the empty space is eliminated. BTS are disclosed and taught in the following U.S. Pat. Nos. 9,001,426, 8,422,148, 7,986,461, 7,782,535, 6,556,352, 6,462,883, 6,377,410, 8,520,311, 7,079,566 and 5,513,201, the entire disclosures of each of which are incorporated herein by reference.

EXAMPLE 11a

The BTSs of Example 10 can be used with the embodiments of Examples 1-9.

EXAMPLE 12

A high power laser source for in situ generation of high power laser beams in a borehole has diode lasers, e.g., chips, that are blue diode laser (450 nm) and are based upon GaN technology. A single diode emitter is about 15 μm×1 μm. The beam that comes from the emitter is highly asymmetrical both spatially (15 μm×1 μm) and in divergence (16 deg×40 deg). The spatial and angular asymmetry are address by a beam transformation system to circularize and fully utilize all of the laser light generated. The emitters are configured into laser bars and then the bars are stacked to from an array of laser diodes. The laser bars have heat sinks. Each emitter in the bar has its own fast axis and slow axis collimator lens. The lenses are preferably positioned with a tolerance of 1 μm or better. This high power laser source can be utilized in the tools, systems and apparatus of Examples 1-9.

EXAMPLE 13

In various laser operations, e.g., pipe cutting, drilling, workover completion, perforating, hydraulic fracturing, pressure containment, in a laser BOP, flow control, an oxidizing agent, and preferably an oxidizing argent that does not readily promote combustion, can be employed, such as $H_2O_2$. The peroxide can form a part of the laser jet, or can be a separate fluid jet or in and around the area of laser operation or laser target area. The oxidizing agent, such as peroxide can be used with the apparatus, devices, laser systems, laser fluid jet systems, configurations and operations that are disclosed and taught in US Patent Publication No. 2012/0074110, Ser. No. 13/222,931; Publication No. 2013/0228372, Ser. Nos. 13/782,869; 14/214,304; Publication No. 2014/0345872, Ser. No. 14/270,288; US Publication No. 2014/0000902, Ser. No. 14/015,003; US Patent Application 2015/0129203, Ser. No. 14/082,026.

EXAMPLE 14

In down hole diode system the electricity is transmitted downhole at 600V and 50 A, for the downhole generation of a 10 kW operation blue laser beam. Once downhole, and preferably in or near the downhole laser generation tool, the electricity is converted to about 104V and 288 A, about 156V and 142 A, about 208V and 192 A.

It being understood that the transmission voltage and amperage, as well as, the "use" voltage and amperage (i.e., the electricity provided directly to the diodes) can vary depending upon the power of the operational laser beam, the number and type of diodes, the configuration of the diodes (both with respect to the tool and with respect to each other) and the depth of the diodes (i.e., the transmission distance).

In general, the transmission voltage for the transmitting the electricity downhole can be greater than 500V, greater than about 600V, greater than about 800V, and greater than about 1,000V, it being understood that high and lower amounts may be used in some embodiments. In general, the amperage for transmitting the electricity downhole can be less than about 100 A, less than about 80 A, less than about 50 A and less than about 30 A, it being understood that high and lower amounts may be used in some embodiments.

In general, the use voltage for the electricity at the diodes can be less than about 300V, less than about 200V, less than about 150V, and less than about 100V, it being understood that high and lower amounts may be used in some embodiments. In general, the use amperage can be from about by greater than 80 A, greater than 100 A, greater than 140 A, greater than 150 A, greater than 180 A, greater than 200 A, and greater than 300 A.

EXAMPLE 15

The cooling fluids, which in some embodiments may also be the working fluids, can be N2, air, water, liquid N2, CO2, liquid CO2, liquid propane, glycol, ethylene glycol, propylene glycol, silicone oil, mud, alcohols, HFCs, MCFCs, HCCs, HCs, CFCs, PFCs, HCFOs, Ammonia, Helium, Argon, CFOs, PFOs, HCOs, HFOs, PCCs, PCOs, In general, materials for cooling fluids, can be: materials such as water that have excellent thermal transfer characteristics; materials that absorb heat through a phase change process. The phase change can be brought about by boiling the liquid or passing the liquid through an expansion nozzle or orifice, in this manner the sudden drop in pressure can cause the liquid to undergo a phase change to gas or to a super critical fluid. Cooling may also be accomplished by using Joule-Thomson cooling effects.

EXAMPLE 16

A visible blue light output laser source comprising a blue laser diode based system can be used to create Stimulated Raman Scattering (SRS) gain in an optical fiber. The blue laser source can be referred to as the pump laser for the Raman laser. The blue laser source can also include a solid state laser source such as a Thulium doped optical fiber. The optical fiber can comprise a multiple layered structure that includes a core region and one or more cladding layers around the core. The numerical aperture (NA) of the core and cladding layers can be varied depending on the core and cladding dopant. A separate SRS laser resonator comprising reflective mirrors, optical beam splitters and lenses can be constructed to enhance the SRS process in the optical fiber. The SRS resonator is designed to allow a light output from the fiber such that aspects of the light are enhanced this can be the color of the light, the laser brightness or the laser line width.

The blue laser diode source can be individual laser diodes or a packaged array. An example of a packaged array could include a commercially available Osram PLPM4-450 50 W diode package. The blue laser sources can be manipulated to improve the spatial density of laser beams output from the sources. The beam collimation and pointing direction of the sources can also be enhanced. The enhanced beam output from the sources can be configured to launch into an optical fiber. The NA of the fiber is selected to allow the efficient launch of a focused blue laser beam. The optical elements for the enhanced beam comprise lenses and mirrors. This optical system can be referred to as a Beam Transformation System (BTS). The blue laser diode source array can be constructed to allow two arrays to be combined into a more powerful array using an optical polarizer and half wave rotation optical waveplate. This is polarization beam combining method (PBC).

(PBC) The output can be further enhanced using dichroic beam combining (DBC) technique. The dichroic beam combining can be accomplished using optical dichroic mirrors or volume Bragg gratings. The DBC can allow one array to be operated at a wavelength within the Raman gain bandwidth of the optical fiber and be transmitted by the combiner. A second array can be selected to be operated at a wavelength within the Raman gain bandwidth of the optical fiber and be reflected by the combiner. Using PBC and DBC allows a fourfold/manifold increase in laser power for launch into the optical fiber. The BTS can be designed to allow the blue source array to be launched into a fiber with a 100 µm core. Using laser powers up to 200 W at a wavelength of 450 nm an output wavelength at 459 nm from the SRS laser resonator can be achieved. An implementation of a SRS laser resonator could comprise a fiber of length 200 m, a high reflector and a partial reflector with reflectivity of 70% at the 459 nm wavelength. The SRS resonator can further include lenses to launch and collimate the laser beams and dichroic mirrors to separate the 450 nm and 459 nm laser beams. The Raman laser in this scheme resonates in the core of the optical fiber and the 450 nm laser pump is also launched into the core. A typical value for the NA of the core of this optical fiber would 0.22 NA. This implementation of the laser can be expected to have conversion efficiency of the 450 nm input laser beam (pump) to the SRS (Raman) 1st Stokes 459 nm output beam of 65% using accepted theoretical model systems as described in the literature. At 200 W of launched power this would create laser beam at 459 nm with a power of 80 W. Using a mm.mRadian definition of beam brightness the Raman laser would have a brightness of 44 mm.mRadians (mm.mR) from the 100 um core with a 0.22 NA.

EXAMPLE 17

The pump laser beam can be launched into a cladding layer of the fiber. This cladding can be designed to have a similar NA as the core in the previous discussion, e.g., 0.22 NA. The cladding can have the same 100 µm diameter also. The blue laser system can therefore use the same BTS and launch scheme. The core of the fiber can be reduced to a smaller value, say 70 µm. The relationship of the core to cladding ratio can be studied using theoretical models and has been discussed in the literature. The core is now designed to have a lower NA than the cladding to allow light generated in the core to remain guided in the core.

The impact of design of the NA of the core to the performance of the Raman laser influences loss mechanisms, bend radius of the fiber and launch parameters for the resonated Raman beams. A typical value for the NA of the core would 0.11. The 459 nm beam is resonant in the core, and typically, only this can be done using a physical aperture to limit the 459 nm beam size in the collimated beam space. Considerable care must be taken to suppress the 2nd Stokes if 459 nm output is desired. The use of spectrally selective mirrors and careful selection of fiber length and output mirror reflectivity of the Raman laser is required. Using a value of 70 µm core to 100 µm cladding the laser can perform with comparable efficiency as the single core operation previously discussed, e.g., 65%. However the brightness of the laser can be increased as the output is from a 70 um core with a 0.11 NA. This provides an output brightness of 15 mm.Rad. Using a 100 W pump provides a 65 W output with three times the brightness, this equates to a 200% increase in power density on a laser target. The 200 W pump will have a slightly lower efficiency due to spectral broadening relative to the Raman gain bandwidth, 50%. However the net increase in power density will be 150% over the original pump source.

Generally, the selection of core size and fiber NA has a large impact on brightness and net efficiency of the system. For example a 50 um core and 0.08 NA will increase brightness by a factor of 6. The smaller core will decrease conversion efficiency from 65% to 45%. This leads to a net increase of power density on target of 270%. A balance of power and power density for the specific application will be used to optimize total system performance.

EXAMPLE 18

This embodiment related to a method of suppressing the 2nd Stokes in the higher brightness Raman laser. The blue source pump laser generates Raman gain as previously in the core and cladding. The 1st Stokes Raman wavelength at 459 nm for a 450 nm pump is created in a resonator as above. The resonator is now designed to resonate a 2nd Stokes Raman wavelength at 468 nm. The 468 nm beam is resonant in the core only this can be done using a physical aperture to limit the 468 nm beam size or via natural gain and loss mechanisms in the fiber itself. The Raman resonator is built using a second partially reflective surface for the 468 nm beam as an output coupler for the Raman laser.

Using theoretical models the reflectivities of the mirrors for the 1st and 2nd Stokes can be selected to optimize output efficiency at 468 nm. Typical embodiment of the system demonstrated experimentally uses >99% reflectivities for both mirrors at 459 nm and one of the 468 nm mirrors and only a low reflectivity of 10% for the second mirror in the 468 nm resonator. The low reflectivity output coupler allows easier suppression of the 3rd Stokes as the resonant field at the 2nd Stokes is significantly reduced relative to the single Stokes implementation. The conversion efficiency of the 2nd Stokes output at 468 nm is comparable to the single Stokes only resonator at 60%. The 468 nm output is originated from a smaller core with a lower NA. The mm.mR (mm mrad) beam brightness is now 15 mm.mR.

The BTS system used above to launch 50 W, 100 W via PBC or 200 W using a DBC and PBC scheme can provide a fiber output with a 0.2 NA and 100 µm beam size. Multiple fibers can be brought together and launched into a single larger aperture fiber with a suitable NA, typically slightly larger than the smaller fibers. If we select a fiber of 1500 nm core size and 0.22 NA this would allow 180 100 µm fibers to be launched into the single large fiber. This provides a capability to launch 9, 18 or 36 kW into the fiber.

EXAMPLE 19

A 1st Stokes resonator design with improved brightness can be realized with output efficiencies around 50% based on a theoretical model with 1000 µm core and 70% output coupler using lengths of 200 m. Individual pump designs can be optimized for specific pump conditions. Using the previous core NA value of 0.11 this provides a net increase in output brightness by a factor of 3. This leads to net improvement in power density on target by 150% for a 50% efficient Raman laser. At 36 kW input this provides 18 kW of 459 nm light output with a higher power density on target than is achievable for a 20 kW, 1 µm source delivered using a 600 µm core with a 0.22 NA.

EXAMPLE 20

A fiber laser system based on a Thulium (Tm) doped fiber can provide a visible blue laser output at wavelengths around 450 nm. The Tm ion has complex energy level transitions with many absorption features and several emission lines. The ion also readily displays excited state absorption (ESA) and energy transfer upconversion (ETU) properties.

The ESA provides an opportunity to use a source with wavelengths around 1 micron to excite an electron from the Tm ground state to the 1G4 energy level. The 1G4 level can decay directly to the ground state via a photonic emission in the blue part of the visible spectrum around 450 nm. When pumping with a conventional Ytterbium or Neodymium doped solid state laser source around 1.06 microns the ground state excitation to the 3H5 level is weakly coupled. This limits the transfer of electrons for the additional ESA processes transfer up to the 1G4 level and create blue light.

The use a Raman laser system to create a laser beam at 1190 nm provides a means of strong coupling the light to transfer electrons from the ground state to the 3H5 state. Additionally a Raman laser beam at 1125 nm can be created to optimize transfer to the 3F3 level. This level has a fast decay to the 3H4 level which can also be effectively pumped with 1125 nm light to the 1G4 level. We have demonstrated a Raman based laser scheme to create strong blue fluorescence in Tm optical fiber. The optimal selection of wavelengths to maximize 1G4 population can be studied using a multiple wavelength Raman laser source. An additional design consideration is to minimize additional ESA from the 1G4 level to the 1D2 level as exciting this level leads to the creation of powerful ultraviolet (UV) photons that can lead to problems with solarization of the fiber. This can also be studied with use of selective pump wavelengths.

The host material of the Tm optical fiber is a key consideration to allow operation at high power and minimize effects of solarization. The composition of the glass, fluoride based or Fused Silica with Alumina or Germanium co-dopants will affect the energy level diagram of the Tm ion and the wavelength selection process for optimization of blue light generation.

The dynamics of the energy level transfer can be studied using theoretical models and these have been discussed in the literature. We have created a model of the Tm ion to allow study of the 1G4 population as a function of pump wavelengths and power. Understanding of the 1G4 population allows a theoretical model of a blue laser system to be created. The Tm fiber is also designed as a multi-clad optical structure. An example of the fiber design would be a 25 µm Tm doped core with a 200 µm cladding surrounded by another guide cladding(s). A Raman laser beam, or beams if multiple wavelengths are used, can be launched into the larger cladding to be absorbed as it propagates through the fiber by the Tm ions in the core. This creates an excited 1G4 population in the fiber that can create optical gain at around 450 nm. A typical range for the dopant density of Tm is 1% to 3% (by weight). However Tm also demonstrates ETU that is related to dopant density as ions can transfer their excited energy states to nearby ions. ETU can occur as function of multi-phonon transfer due to de-excitation of an excited ion by a non radiative process. ETU is considered a method for excitation of the 1G4 level. The fiber composition and Tm doping density will have a direct impact on the ETU process. A way to mitigate the ETU process is by using very low doping densities of around 0.2%. This keeps the ions far enough apart that phononic transfer of energy via the crystal lattice is minimized.

A non ETU energized 1G4 population allows the ESA selected process to control Tm fiber laser gain dynamics. However ETU should be considered as part of the development of the Tm blue fiber laser. A viable theoretical analysis of the Tm ion dynamics under pump conditions requires knowledge of the Tm energy levels and their associated decay lifetimes, emission and absorption cross-sections. Using available data the model can be created and the 1G4 population analyzed. An example of the model. An example of an experimentally measured output from a Tm fiber.

The 1125 nm and 1190 nm pumps each have an associated phononic decay in the pump process. The quantum defect for the pumps is 0.8 and 0.75 respectively. The net maximum pump efficiency is ~60%. Energy losses to alternate wavelengths such 630 nm, 800 nm and 1800 nm need to be minimized. In a resonator the slope efficiency can be estimated at ~35%. It is difficult to estimate 450 nm intracavity losses but with reasonable values comparable to standard IR cavities this slope should be achievable. For example a Raman laser operating with outputs at 1125 nm and 1190 nm totaling 10 kW of pump would provide approximately 3 kW output power. Our current design uses a 25 µm core and 200 uµm cladding. The core NA is ~0.1. The brightness of this laser is 5 mm.mRad. 3 kW from this fiber would also provide a higher power density than a 20 kW, 600 um 0.22 NA system at 1070 nm.

EXAMPLE 21

Embodiments of techniques that allow sources to be scaled in power and brightness through active and passive coherent beam combination. Active beam combination is generally achieved by using a phase control of the individual laser beams. The phase control could be an electro-optic modulator or acousto-optic phase modulator where an RF signal is used to advance or retard a laser beam phase by manipulation of the optical properties of the modulator material. The system can have a sensor or series of sensors to monitor the individual and combined laser beams. An electronic control and algorithm system will be used to dynamically compute the requirements for the individual phase adjustments via RF signals. By controlling the phase fronts of the laser beams as they propagate through a common aperture or to a common target the beams can be coherently added to produce a central lobe, which is significantly brighter than the individual laser beam or the individual beams incoherently added with randomly phased wavefront relationships at the target.

Passive combination controls the phase coherence of several laser beams by interaction of the laser beams themselves. This can be through evanescent wave coupling between fibers or modal interactions in a common arm of a resonator structure that incorporates several gain media. The gain media in this case could be laser diodes. The method of interaction can be through spectral selection to a common mirror via diffraction grating or other spectrally dispersive or selective medium.

EXAMPLE 22

The initial laser beams, beamlets, combinations of the initial laser beam, as well as operation laser beams can be combined in parallel (e.g., 5, 10, 100 beamlets to a single beam) or in parallel serially (e.g., 50 groups of 10 beams combined to from 50 single beams which are then combined to form a single beam) and combinations and variations of these. Downhole embodiments of these beam combiners can use spectral, coherent and fiber beam combining, and combinations and variations of these, as well as, other beam combining technologies. In the present inventions embodiments of these technologies are modified, and adapted for use in confined and harsh downhole environment and conditions. General teachings and disclosure of beam combining technology are provided in US Patent Publication Nos. 2011/0305256, and 2012/0281948 and in U.S. Pat. Nos. 8,526,110 and 7,884,997 the entire disclosures of each of which are incorporated herein by reference.

The apparatus and methods of the present invention may be used with drilling rigs and equipment such as in exploration and field development activities. Thus, they may be used with, by way of example and without limitation, land based rigs, mobile land based rigs, fixed tower rigs, barge rigs, drill ships, jack-up platforms, and semi-submersible rigs. They may be used in operations for advancing the well bore, finishing the well bore and workover activities, including perforating the production casing. They may further be used in window cutting and pipe cutting and in any application where the delivery of the laser beam to a location, apparatus or component that is located deep in the well bore may be beneficial or useful.

The various embodiments of systems, equipment, techniques, methods, activities and operations set forth in this specification may be used for various other activities and in other fields in addition to those set forth herein. Additionally, these embodiments, for example, may be used with: other equipment or activities that may be developed in the future; and with existing equipment or activities which may be modified, in-part, based on the teachings of this specification. Further, the various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed:

1. A high power laser source for generating high power beams in situ in a borehole, the laser source comprising:
   a. a downhole assembly having an outer housing, the outer housing defining a first cavity, a length and an axis;
   b. a cooling assembly in thermal contact with the first cavity:
   c. a semiconductor laser module assembly located in the first cavity, the semiconductor laser module assembly comprising: an outer wall defining a second cavity;
   d. a plurality of laser units located in the second cavity, each laser unit in thermal contact with the cooling assembly; each laser unit comprising a plurality of diode lasers;
   e. the laser diodes configured in the laser units, wherein the laser diodes are capable of generating a plurality of initial laser beamlets, wherein the initial laser beamlets from the laser units have substantially parallel beamlet paths and a spacing between the beamlet paths;
   f. the laser units configured in the second cavity, whereby the substantially parallel beamlet paths are directed toward a beam transformation system;
   g. the beam transformation system containing optics, wherein the beamlet paths are directed in a direction substantially parallel to the axis, and wherein the spacing between the beamlet paths is reduced; and,
   h. a focusing optics package, wherein an operation laser beam is formed.

2. The laser source of claim 1, wherein the laser beamlets from each laser unit have a total power of greater than 10W, a wavelength from about 400 nm to about 900 nm, and an $M^2$ of less than 100.

3. The laser source of claim 2, wherein the operational beam has a power of greater than 5 kW and an $M^2$ of less than 50.

4. The laser source of claim 2, wherein the operational beam has a power of greater than 10 kW and an $M^2$ of less than 20.

5. The laser source of claim 2, wherein the operational beam has a power of greater than 10 kW and an $M^2$ of less than 20, and a wavelength from about 400 nm to about 500 nm.

6. The laser source of claim 2, wherein the operational beam has a power of greater than 10 kW and an $M^2$ of less than 20, and a wavelength from about 500 nm to about 600 nm.

7. The laser source of claim 1, wherein the laser beamlets have a power of greater than 0.25 W, a wavelength from about 400 nm to about 900 nm, and an $M^2$ of less than 50.

8. The laser source of claim 7, wherein the operational beam has a power of greater than 5 kW and an $M^2$ of less than 20.

9. The laser source of claim 1, wherein the initial beamlet paths are substantially normal to the axis.

10. The laser source of claim 1 comprising a source of electrical power, wherein the electrical power source lowers an incoming voltage and increases an current to provide a transformed electrical power to the laser units.

11. The laser source of claim 7 comprising a source of electrical power, wherein the electrical power source lowers an incoming voltage and increases a current to provide a transformed electrical power supply to the laser units; wherein the incoming voltage is from about 400V to 1,000V and the incoming current is from about 40 A to 100 A; and the transformed electrical power supply has a voltage of from about 80V to 300V and a current of from about 80 A to 300 A.

12. A system for generating a high power operational laser beam in situ in a borehole, the system comprising:
   a. a mobile field unit, the mobile field unit comprising a control unit, a cooling system, conveyance structure, the conveyance structure having a proximal end and a distal end;
   b. the conveyance structure comprising a line structure, a cooling fluid delivery line, and an electrical power line;
   c. a downhole assembly in mechanical, fluid and electrical association with the distal end of the conveyance structure, whereby electrical power and cooling fluid can be supplied to the downhole assembly;
   d. the downhole assembly having an outer housing, the outer housing defining a first cavity, a length and an axis;
   e. a cooling assembly located in the first cavity, the cooling assembly having a cooling fluid flow channel, the fluid flow channel in fluid communication with the conveyance structure fluid delivery line;
   f. a semiconductor laser module assembly located in the first cavity, the semiconductor laser module assembly comprising: an outer wall defining a second cavity;
   g. a plurality of laser units located in the second cavity, each laser unit in thermal contact with the cooling assembly; each laser unit comprising a plurality of diode lasers;
   h. the laser diodes configured in the laser units, wherein the laser diodes are capable of generating a plurality of initial laser beamlets, wherein the initial laser beamlets from the laser units have substantially parallel beamlet paths and a spacing between the beamlet paths;
   i. the laser laser units configured in the second cavity, whereby the substantially parallel beamlet paths are directed toward a beam transformation system;
   j. the beam transformation system containing optics, wherein the beamlet paths are directed in a direction substantially parallel to the axis, and wherein the spacing between the beamlet paths is reduced; and,
   k. a focusing optics package, wherein an operation laser beam is formed.

13. The laser source of claim 12, wherein the laser beamlets from each laser unit have a total power of greater than 10 W, a wavelength from about 400 nm to about 900 nm, and an $M^2$ of less than 100.

14. The laser source of claim 12, wherein the operational beam has a power of greater than 10 kW and an $M^2$ of less than 20, and a wavelength from about 400 nm to about 500 nm.

15. The laser source of claim 12, wherein the operational beam has a power of greater than 10 kW and an $M^2$ of less than 20, and a wavelength from about 500 nm to about 600 nm.

16. The laser systems of claim 12, wherein the cooling system comprises an aqueous coolant, and has the capability to flow the coolant at a flow rate of at least about 2 gpm.

* * * * *